United States Patent
Lutgen

(10) Patent No.: US 10,964,844 B2
(45) Date of Patent: Mar. 30, 2021

(54) HIGH-EFFICIENCY MICRO-LEDS

(71) Applicant: Facebook Technologies, LLC, Menlo Park, CA (US)

(72) Inventor: Stephan Lutgen, Dresden (DE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/572,945

(22) Filed: Sep. 17, 2019

(65) Prior Publication Data
US 2020/0105968 A1    Apr. 2, 2020

Related U.S. Application Data

(63) Continuation of application No. 15/969,523, filed on May 2, 2018, now Pat. No. 10,468,552.
(Continued)

(51) Int. Cl.
*H01L 33/00* (2010.01)
*H01L 33/20* (2010.01)
(Continued)

(52) U.S. Cl.
CPC .............. *H01L 33/20* (2013.01); *H01L 33/06* (2013.01); *H01L 33/46* (2013.01); *H01L 33/58* (2013.01)

(58) Field of Classification Search
CPC ......... H01L 33/20; H01L 33/46; H01L 33/58; H01L 33/06
See application file for complete search history.

(56) References Cited

U.S. PATENT DOCUMENTS

| 4,603,420 A | 7/1986 | Nishizawa et al. |
| 7,418,014 B2 | 8/2008 | Mochizuki |
(Continued)

FOREIGN PATENT DOCUMENTS

WO    2015086704 A1    6/2015

OTHER PUBLICATIONS

U.S. Appl. No. 15/824,970, "U.S. Patent Application No.", Optical Waveguides in Micro-LED Devices, filed Nov. 28, 2017, 44 pages.
(Continued)

*Primary Examiner* — Nikolay K Yushin
(74) *Attorney, Agent, or Firm* — Weaver Austin Villeneuve & Sampson LLP

(57) ABSTRACT

Disclosed herein are light emitting diodes (LEDs) having a high efficiency. A light emitting diode including an active light emitting layer within a semiconductor layer is provided. The semiconductor layer has a mesa shape. The light emitting diode also includes a substrate having a first surface on which the semiconductor layer is positioned and an outcoupling surface opposite to the first surface. Light generated by the active light emitting layer is incident on the outcoupling surface and propagates toward an optical element downstream of the outcoupling surface. The light emitting diode also includes a first anti-reflection coating adjacent to the outcoupling surface; an index-matched material between the outcoupling surface and the optical element, wherein an index of refraction of the index-matched material is greater than or equal to an index of refraction of the optical element; and/or secondary optics adjacent to the outcoupling surface.

9 Claims, 29 Drawing Sheets

Related U.S. Application Data

(60) Provisional application No. 62/651,044, filed on Mar. 30, 2018.

(51) Int. Cl.
  *H01L 33/06* (2010.01)
  *H01L 33/58* (2010.01)
  *H01L 33/46* (2010.01)

(56) References Cited

U.S. PATENT DOCUMENTS

| | | | |
|---|---|---|---|
| 7,518,149 | B2 | 4/2009 | Maaskant et al. |
| 7,843,982 | B2 | 11/2010 | Chua et al. |
| 8,351,479 | B2 | 1/2013 | Lutgen et al. |
| 8,384,114 | B2 | 2/2013 | Tischler et al. |
| 9,450,148 | B2 | 9/2016 | Shepherd |
| 9,484,492 | B2 | 11/2016 | Bour et al. |
| 10,468,552 | B2 | 11/2019 | Lutgen |
| 10,475,960 | B2 * | 11/2019 | Jung ............. H01L 33/00 |
| 2002/0105809 | A1 | 8/2002 | Kujik et al. |
| 2007/0153857 | A1 | 7/2007 | Chua et al. |
| 2008/0248602 | A1 | 10/2008 | Erchak et al. |
| 2009/0304039 | A1 | 12/2009 | Lutgen et al. |
| 2010/0158067 | A1 | 6/2010 | Nakatsuka et al. |
| 2011/0186874 | A1 | 8/2011 | Shum |
| 2012/0146066 | A1 | 6/2012 | Tischler et al. |
| 2012/0168714 | A1 * | 7/2012 | Chu ............. H01L 33/405 257/13 |
| 2012/0273824 | A1 | 11/2012 | Gmeinwieser et al. |
| 2015/0236201 | A1 | 8/2015 | Shepherd |
| 2016/0197232 | A1 | 7/2016 | Bour et al. |
| 2019/0058088 | A1 * | 2/2019 | Jung ............. H01L 33/32 |

OTHER PUBLICATIONS

U.S. Appl. No. 15/969,523, "Corrected Notice of Allowance", dated Jun. 20, 2019, 9 pages.
U.S. Appl. No. 15/969,523, "Non-Final Office Action", dated Dec. 3, 2018, 12 pages.
U.S. Appl. No. 15/969,523, "Notice of Allowance", dated Jun. 17, 2019, 13 pages.
U.S. Appl. No. 16/369,059, "Non-Final Office Action", dated Aug. 9, 2019, 18 pages.
U.S. Appl. No. 16/369,069, "Non-Final Office Action", dated Aug. 12, 2019, 11 pages.
U.S. Appl. No. 16/369,076, "Non-Final Office Action", dated Aug. 9, 2019, 11 pages.
Aleksiejunas, et al., "Impact of Diffusivity to Carrier Recombination Rate in Nitride Semiconductors:From Bulk GaN to (In,Ga)N Quantum Wells", Japanese Journal of Applied Physics, vol. 52, No. 8S, 08JK01, May 20, 2013, pp. 08JK01-1-08JK01-5.
Bulashevich, et al., "Impact of Surface Recombination on Efficiency of III-Nitride Light-Emitting Diodes", Physica Status Solidi (RRL)-Rapid Research Letters, Jun. 2016, pp. 1-5.
Chen, et al., "Electrically Pumped Continuous-Wave III-V Quantum Dot Lasers on Silicon", Nature Photonics, Mar. 7, 2016, 6 pages.
Frost, et al., "High Performance Red-Emitting Multiple Layer InGaN/GaN Quantum Dot Lasers", Japanese Journal of Applied Physics vol. 55, 032101, Feb. 5, 2016, pp. 032101-1-032101-4.
Lee, et al., "SiNx-Induced Intermixing in AlInGaAs/InP Quantum Well Through Interdiffusion of Group III Atoms", Journal of Applied Physics, vol. 112, No. 9, 093109, Nov. 2012, pp. 093109-1-093109-4.
Lutgen, et al., "Recent Results of Blue and Green InGaN Laser Diodes for Laser Projection", Proceedings of SPIE, vol. 7953, 79530G, Feb. 16, 2011, pp. 79530G-1-79530G-12.
Peter, et al., "LED Epitaxy Technology and Packaging Trends", OSRAM, Opto Semiconductors, EBV-Lighting Academy, Frankfurt, Mar. 16, 2016, 48 pages.
Scajev, et al., "Diffusion-Limited Nonradiative Recombination at Extended Defects in Hydride Vapor Phase Epitaxy GaN Layers", Applied Physics Letters, vol. 98, No. 20, 202105, May 19, 2011, pp. 202105-1-202105-3.
Schiavon, et al., "Wavelength-Dependent Determination of the Recombination Rate Coefficients in Single-Quantum-Well GaInN/GaN Light Emitting Diodes", Phys. Status Solidi B, vol. 250, No. 2, Nov. 28, 2012, pp. 283-290.
Shen, et al., "Enabling Area-Selective Potential-Energy Engineering in InGaN/GaN Quantum Wells by Post-Growth Intermixing", Optics Express, vol. 23, No. 6, Mar. 19, 2015, 8 pages.
Stanchu, et al., "High-Resolution X-Ray Diffraction Analysis of Strain Distribution in GaN Nanowires on Si(111) Substrate", Nanoscale Research Letters, vol. 10, No. 51, Feb. 6, 2015, 5 pages.
Walker, "Minority Carrier Diffusion Lengths and Mobilities in Low-Doped n-InGaAs for Focal Plane Array Applications", Infrared Technology and Applications XLIII, vol. 10177, Jul. 25, 2017, pp. 1-9.
Yadav, et al., "AlGaInP Red-Emitting Light Emitting Diode Under Extremely High Pulsed Pumping", Proc. of SPIE, 97681K-1, vol. 9768, Mar. 8, 2016, pp. 97681K-1-97681K-7.
Zhao, et al., "Toward Ultimate Efficiency: Progress and Prospects on Planar and 3D Nanostructured Nonpolar and Semipolar InGaN Light-Emitting Diodes", Advances in Optics and Photonics, vol. 10, No. 1, Mar. 2018, pp. 246-308.
PCT Application No. PCT/US19/24408, "International Search Report and Written Opinion", dated Jun. 21, 2019, 9 pages.
U.S. Appl. No. 16/369,069, "Notice of Allowance", dated Jan. 14, 2020, 8 pages.
U.S. Appl. No. 16/369,076, "Notice of Allowance", dated Jan. 31, 2020, 8 pages.

* cited by examiner

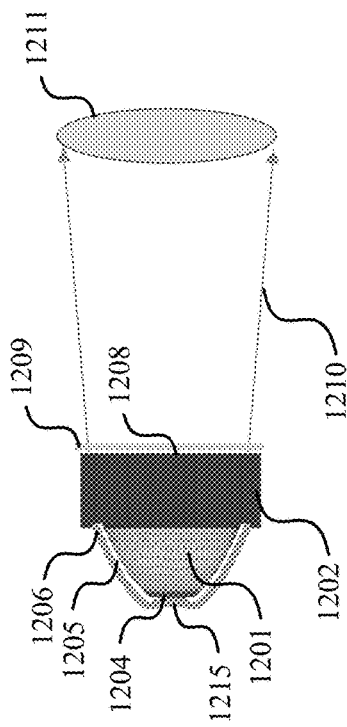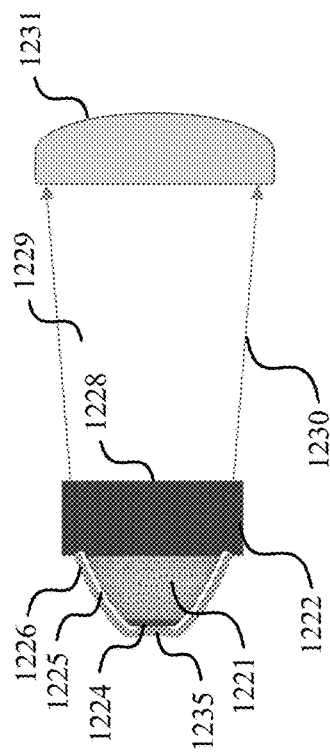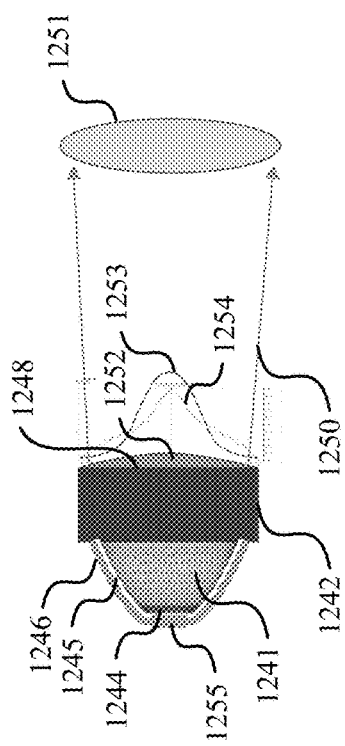

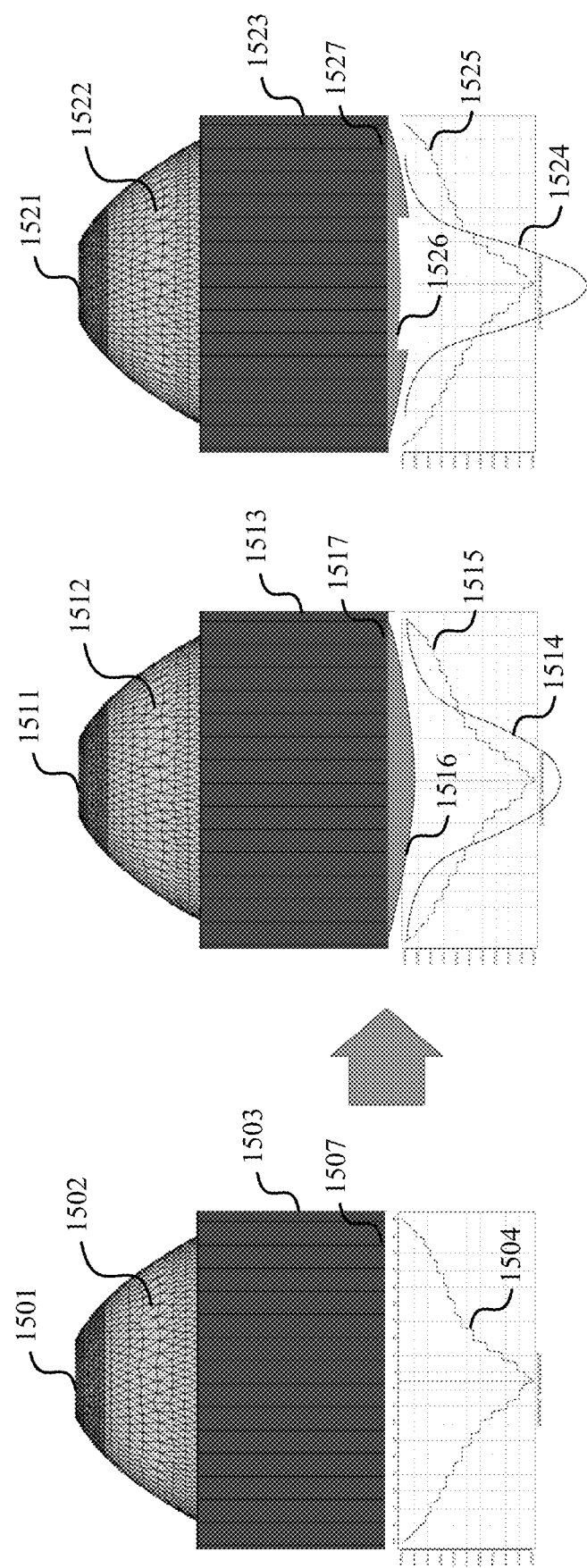

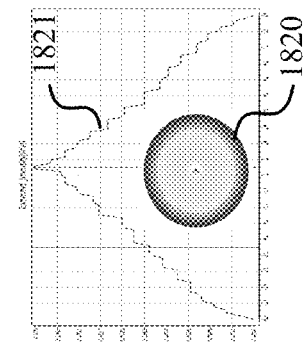
FIG. 18D
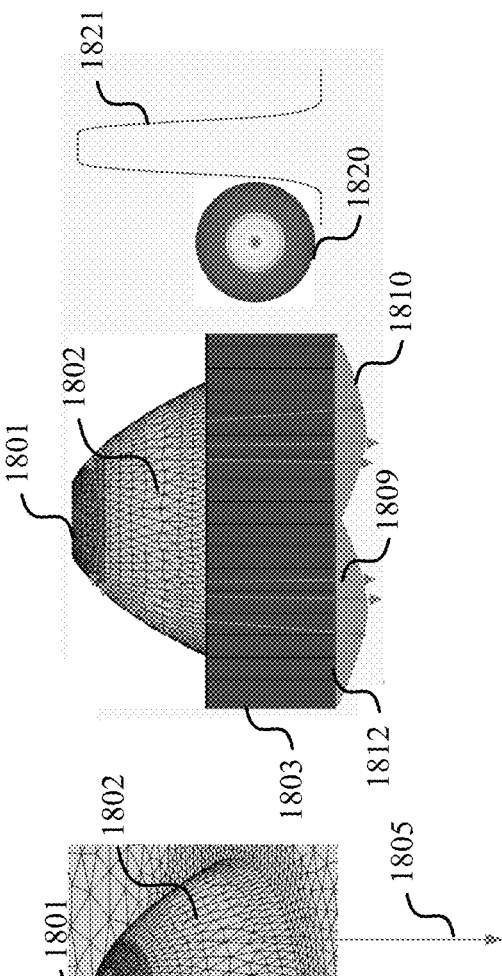
FIG. 18C
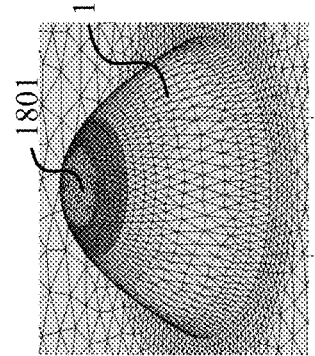
FIG. 18B
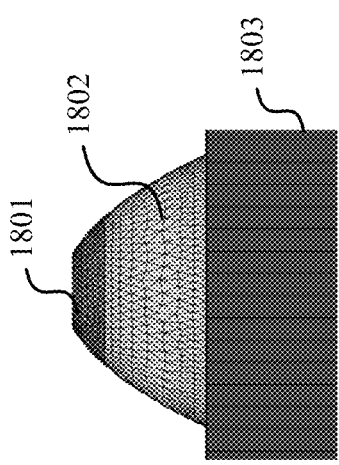
FIG. 18A
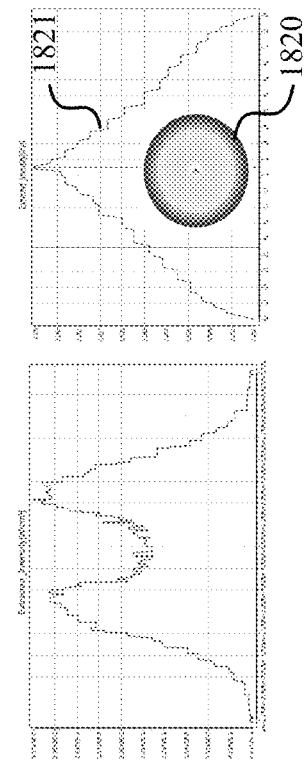
FIG. 18H
FIG. 18G
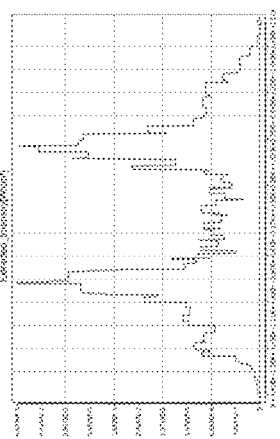
FIG. 18F
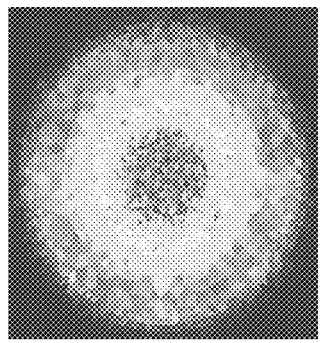
FIG. 18E

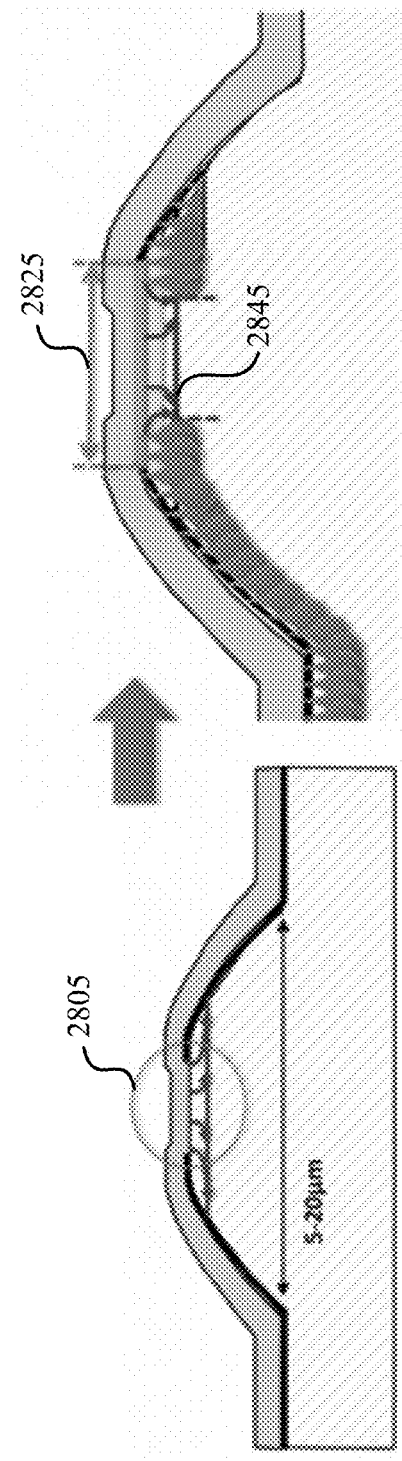

HIGH-EFFICIENCY MICRO-LEDS

CROSS-REFERENCE TO RELATED APPLICATION

This application is a continuation of U.S. Non-Provisional application Ser. No. 15/969,523, filed on May 2, 2018, titled "HIGH-EFFICIENCY MICRO-LEDS," which claims priority under 35 U.S.C. § 119 to U.S. Provisional Application No. 62/651,044, filed on Mar. 30, 2018, titled "SIMULATION MICRO-LED DESIGNS," the contents of which are hereby incorporated by reference in their entireties for all purposes.

BACKGROUND

Light emitting diodes (LEDs) convert electrical energy into optical energy. In semiconductor LEDs, light is usually generated through recombination of electrons and holes within a semiconductor layer. A challenge in the field of LEDs is to extract as much of the emitted light as possible toward the desired direction. Various approaches may be used to increase the efficiency of an LED, such as adjusting the shape of the semiconductor layer, roughening the surface of the semiconductor layer, and using additional optics to redirect or focus the light.

Micro-LEDs are being developed for various applications in display technology. A micro-LED has a very small chip size. For example, a linear dimension of the chip may be less than 50 µm or less than 10 µm. The linear dimension may be as small as 2 µm or 4 µm. However, micro-LEDs typically have a lower efficiency than large-power LEDs. While large-power LEDs may have a light extraction efficiency (LEE) of up to 90%, micro-LEDs typically have a LEE on the order of 10% within an emission cone having an angle of 90°, and 0.5% within an emission cone having an angle of 10°. For example, a large-power LED or a micro-LED, such as the planar LED 800 shown in FIG. 29, typically has a planar LED Lambertian pattern 830 with a full-width at half-maximum (FWHM) of approximately 120° and a half-width at half-maximum (HWHM) of approximately 60°. A vertical micro-LED, similar to the hemispherical LED 810 shown in FIG. 29, typically has a hemispherical LED pattern 840 with a HWHM greater than or equal to 60°, in which side wall emission may lead to bunny ears. Further, a parabolic LED 820 typically has a parabolic LED emission 850 with a more narrow profile having a HWHM less than 60°, and typically between 20° and 40°. Accordingly, it would be advantageous to increase the LEE of micro-LEDs, and to provide an output beam with a narrower beam profile.

SUMMARY

The present disclosure generally relates to micro-LEDs having an improved efficiency. In certain embodiments, a light emitting diode includes an active light emitting layer within a semiconductor layer. The semiconductor layer has a mesa shape. The light emitting diode also includes a substrate having a first surface on which the semiconductor layer is positioned and an outcoupling surface opposite to the first surface. Light generated by the active light emitting layer is incident on the outcoupling surface and propagates toward an optical element downstream of the outcoupling surface. The light emitting diode also includes a first anti-reflection coating adjacent to the outcoupling surface; an index-matched material between the outcoupling surface and the optical element, wherein an index of refraction of the index-matched material is greater than or equal to an index of refraction of the optical element; and/or secondary optics adjacent to the outcoupling surface.

The the mesa shape may be of planar, vertical, conical, semi-parabolic, and/or parabolic, and a base area of the mesa may be circular, rectangular, hexagonal, and/or triangular. The light emitting diode may also include a reflector layer on an outer surface of the mesa shape. The reflector layer may include, in order from the outer surface of the mesa shape, a dielectric passivation layer, an adhesion layer, a diffusion barrier layer, and a coating layer.

The index-matched material may be butt-coupled to the optical element, and the optical element may include a waveguide. The semiconductor layer may include an n-side semiconductor layer adjacent to the substrate and a p-side semiconductor layer opposite to the active light emitting layer.

The secondary optics may include a lens having a focal point at the active light emitting layer. The lens may be a spherical lens or a Fresnel lens. A diameter of the lens may be greater than a diameter of the semiconductor layer adjacent to the substrate. The lens may be etched into the outcoupling surface. The lens may have different lens shapes along a lateral direction of the lens, or a donut-like recess area and a focal point that are configured to out-couple different groups of rays from the light emitting diode within an emission cone having a half-width at half-maximum (HWHM) less than or equal to 60°.

The secondary optics may be configured to emit light having a beam profile with a substantially top-hat shape and a half-width at half-maximum (HWHM) less than or equal to 60°. The secondary optics may also include additional spherical lenses that are configured to collimate light reflected by a facet of the mesa shape. The secondary optics may also include a second anti-reflection coating on a surface of the lens opposite to the outcoupling surface. The secondary optics may also include a grating etched into the outcoupling surface, the grating may include a linear array that reflects transverse electric (TE) light at a different percentage than transverse magnetic (TM) light, and the light emitting diode may provide polarized light emission.

A linear dimension of the outcoupling surface in a plane perpendicular to an emission direction of light from the outcoupling surface may be less than 60 µm. The light emitting diode may have a first light extraction efficiency between 50% and 85% within a first emission cone having a first angle of 90°, and a second light extraction efficiency between 2% and 6% within a second emission cone having an second angle of 10°.

In certain embodiments, a light emitting diode includes an active light emitting layer within a semiconductor layer. The semiconductor layer has a mesa shape. The light emitting diode also includes a substrate having a first surface on which the semiconductor layer is positioned and an outcoupling surface opposite to the first surface. The light emitting diode also includes a reflector layer on an outer surface of the mesa shape. The reflector layer induces, in order from the outer surface of the mesa shape, a dielectric passivation layer, a metal layer, a diffusion barrier layer, and a conformal coating layer.

A thickness of the dielectric passivation layer may be between 60 nm and 80 nm, a thickness of the metal layer may be between 80 and 120 nm, a thickness of the diffusion barrier layer may be between 20 and 30 nm, and a thickness of the conformal coating layer may be between 110 and 140 nm.

The dielectric passivation layer may include SiN, SiO$_2$, HfO, AlN, and/or AlO. The metal layer may include Ag, Al, or Au, and may be configured to provide adhesion between the dielectric passivation layer and the diffusion barrier layer. The diffusion barrier layer may include Pt, Pd, WTi, or WN. The conformal coating layer may include Au or Al. The dielectric passivation layer and the metal layer may be configured to prevent resonant absorption losses inside the reflector layer.

The light emitting diode may also include a p-contact on a surface of the semiconductor layer opposite to the outcoupling surface. The p-contact may include, in order from the surface of the semiconductor layer, the metal layer, the diffusion barrier layer, and the coating layer.

The mesa shape may be parabolic, the mesa shape may have a height of approximately 1.5 μm, and the mesa shape may have a largest diameter in a plane parallel to the outcoupling surface of approximately 3.0 μm. The light emitting diode may have a first light extraction efficiency between 45% and 55% within a first emission cone having a first angle of 90°, and a second light extraction efficiency between 2% and 3% within a second emission cone having an second angle of 10°.

The active light emitting layer may be arranged at a focal point of the mesa shape. A facet of the mesa shape may be sufficiently smooth to prevent non-radiative recombination of electrons and holes at the facet.

The light emitting diode may also include ions that are implanted in the active light emitting layer. Different atoms may be intermixed within the active light emitting layer. The active light emitting layer may include quantum dots. The active light emitting layer may include a lateral quantum barrier. The reflector layer may have a reflectivity greater than 80%.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings. Additional details may be found in the Appendix.

BRIEF DESCRIPTION OF THE DRAWINGS

Illustrative embodiments are described in detail below with reference to the following figures:

FIGS. 12A-12C show various examples of green micro-LEDs having different components on the outcoupling surface to optimize the LEE and the beam profile;

FIGS. 15A-15C show various examples of red micro-LEDs having different secondary optics to optimize the LEE and the beam profile;

FIGS. 18A-18H show examples of a red micro-LED having secondary optics to optimize the LEE and the beam profile;

FIGS. 28A and 28B show an example of a method of reducing the lateral current spreading by performing lateral ion implantation for a defined current aperture.

DETAILED DESCRIPTION

Figure 1:
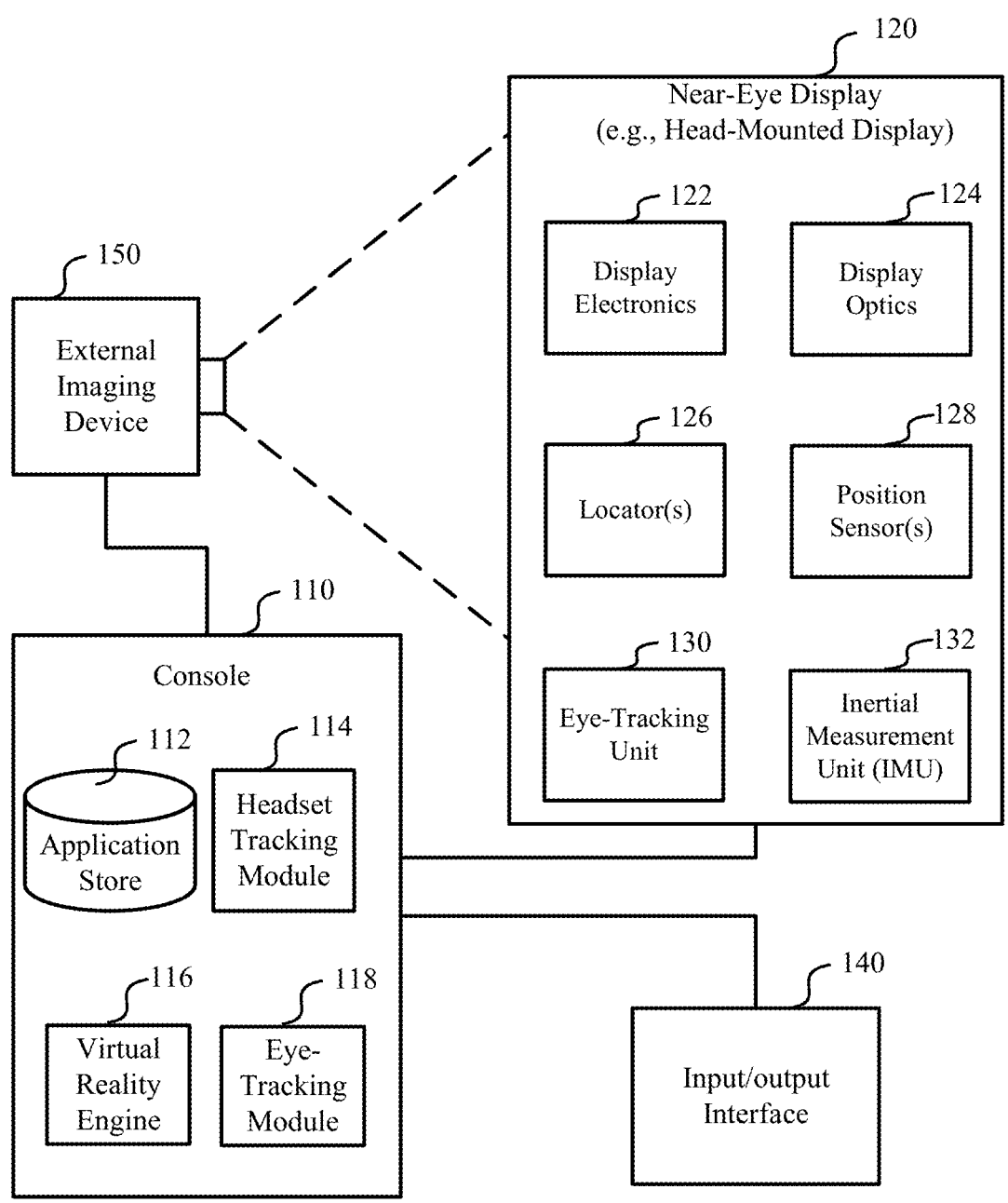
FIG. 1 is a simplified block diagram of an example artificial reality system environment including a near-eye display, according to certain embodiments.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof.

As used herein, ultraviolet (UV) light may refer to light with a wavelength between about 100 nm and about 440 nm. Visible light may refer to light with a wavelength between about 380 nm and about 750 nm. More specifically, blue light may refer to light with a wavelength between about 440 nm and about 495 nm. Green light may refer to light with a wavelength between about 495 nm and about 570 nm. Red light may refer to light with a wavelength between about 580 nm and about 750 nm. Near infrared (NIR) light may refer to light with a wavelength between about 750 nm and about 2500 nm.

As used herein, a reflector for a wavelength range may refer to an optical device that can reflect at least 20%, at least 50%, at least 70%, or more of incident light in the wavelength range. Some reflectors may reflect less than 20%, less than 10%, less than 5%, less than 1%, or less of incident light outside the working wavelength range of the reflectors. The reflectivity may be represented by either a photo-optically weighted or an unweighted average reflectivity over a wavelength range, an angular range of incident beam angle to surface normal, or the lowest reflectivity over a wavelength range. For example, a reflector may include a mirror having metallic coatings or dielectric thin films, a distributed Bragg reflector (DBR), or a metamorphic layer.

As used herein, a micro-LED may refer to an LED that has a chip size with a linear dimension of the chip that is less than 50 µm, less than 20 µm, or less than 10 µm. For example, the linear dimension may be as small as 2 µm or 4 µm. However, the disclosure herein is not limited to micro-LEDs, and may also be applied to mini-LEDs or large-power LEDs.

The micro-LEDs described herein may be used in conjunction with various technologies, such as an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

An artificial reality system, such as a virtual reality (VR), augmented reality (AR), or mixed reality (MR) system, may include a near-eye display (e.g., a headset or a pair of glasses) configured to present content to a user via an electronic or optic display and, in some cases, may also include a console configured to generate content for presentation to the user and to provide the generated content to the near-eye display for presentation. To improve user interaction with presented content, the console may modify or generate content based on a location where the user is looking, which may be determined by tracking the user's eye. Tracking the eye may include tracking the position and/or shape of the pupil of the eye, and/or the rotational position (gaze direction) of the eye. To track the eye, the near-eye display may illuminate a surface of the user's eye using light sources mounted to or within the near-eye display. An imaging device (e.g., a camera) included in the near-eye display may then capture light reflected by various surfaces of the user's eye. Light that is reflected specularly off the cornea of the user's eye may result in "glints" in the captured image. One way to illuminate the eye to see the pupil as well as the glints is to use a two-dimensional (2D) array of light-emitting diodes (LEDs). These LEDs may be placed at the periphery of the user's field of view (e.g., along the circumference of the viewing optics). Techniques such as a centroiding algorithm may be used to accurately determine the locations of the glints on the eye in the captured image, and the rotational position (e.g., the gaze direction) of the eye may then be determined based on the locations of the glints relative to a known feature of the eye (e.g., the center of the pupil) within the captured image.

FIG. 1 is a simplified block diagram of an example artificial reality system environment 100 including a near-eye display 120, in accordance with certain embodiments. Artificial reality system environment 100 shown in FIG. 1 may include near-eye display 120, an external imaging device 150, and an input/output interface 140 that are each coupled to a console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and content received from console 110, or from any other console generating and providing content to a user. Therefore, near-eye display 120, and methods for eye tracking described herein, may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, one or more locators 126, one or more position sensors 128, an eye-tracking unit 130, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display images to the user according to data received from console 110. In various embodiments, display electronics 122 may include one or more display panels, such as a liquid crystal display (LCD), an organic light emitting diode (OLED) display, a micro-LED display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include sub-pixels to emit light of a predominant color such as red, green, blue, white, or yellow. In some implementations, display electronics 122 may display a 3D image through stereo effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers), or magnify image light received from display electronics 122, correct optical errors associated with the image light, and present the corrected image light to a user of near-eye display 120. In various embodiments, display optics 124 may include one or more optical elements. Example optical elements may include a substrate, optical waveguides, an aperture, a Fresnel lens, a convex lens, a concave lens, a filter, or any other suitable optical element that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. In some embodiments, display optics 124 may have an effective focal length larger than the spacing between display optics 124 and display electronics 122 to magnify image light projected by display electronics 122. The amount of magnification of image light by display optics 124 may be adjusted by adding or removing optical elements from display optics 124.

Display optics 124 may be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism. In some embodiments, content provided to display electronics 122 for display may be pre-distorted, and display optics 124 may correct the distortion when it receives image light from display electronics 122 generated based on the pre-distorted content.

Locators 126 may be objects located in specific positions on near-eye display 120 relative to one another and relative to a reference point on near-eye display 120. Console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

In some embodiments, locators 126 may be located beneath an outer surface of near-eye display 120. A portion of near-eye display 120 between a locator 126 and an entity external to near-eye display 120 (e.g., external imaging device 150, a user viewing the outer surface of near-eye display 120) may be transparent to the wavelengths of light emitted or reflected by locators 126 or is thin enough to not substantially attenuate the light emitted or reflected by locators 126. In some embodiments, the outer surface or other portions of near-eye display 120 may be opaque in the visible band, but is transparent in the IR band, and locators 126 may be under the outer surface and may emit light in the IR band.

External imaging device 150 may generate slow calibration data based on calibration parameters received from console 110. Slow calibration data may include one or more images showing observed positions of locators 126 that are detectable by external imaging device 150. External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more imaging devices configured to capture eye tracking data, which an eye-tracking module 118 in console 110 may use to track the user's eye. Eye tracking data may refer to data output by eye-tracking unit 130. Example eye tracking data may include images captured by eye-tracking unit 130 or information derived from the images captured by eye-tracking unit 130. Eye tracking may refer to determining an eye's position, including orientation and location of the eye, relative to near-eye display 120. For example, eye-tracking module 118 may output the eye's pitch and yaw based on images of the eye captured by eye-tracking unit 130. In various embodiments, eye-tracking unit 130 may measure electromagnetic energy reflected by the eye and communicate the measured electromagnetic energy to eye-tracking module 118, which may then determine the eye's position based on the measured electromagnetic energy. For example, eye-tracking unit 130 may measure electromagnetic waves such as visible light, infrared light, radio waves, microwaves, waves in any other part of the electromagnetic spectrum, or a combination thereof reflected by an eye of a user.

Eye-tracking unit 130 may include one or more eye-tracking systems. An eye-tracking system may include an imaging system to image one or more eyes and may optionally include a light emitter, which may generate light that is directed to an eye such that light reflected by the eye may be captured by the imaging system. For example, eye-tracking unit 130 may include a coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

In some embodiments, eye-tracking unit 130 may include one light emitter and one camera to track each of the user's eyes. Eye-tracking unit 130 may also include different eye-tracking systems that operate together to provide improved eye tracking accuracy and responsiveness. For example, eye-tracking unit 130 may include a fast eye-tracking system with a fast response time and a slow eye-tracking system with a slower response time. The fast eye-tracking system may frequently measure an eye to capture data used by eye-tracking module 118 to determine the eye's position relative to a reference eye position. The slow eye-tracking system may independently measure the eye to capture data used by eye-tracking module 118 to determine the reference eye position without reference to a previously determined eye position. Data captured by the slow eye-tracking system may allow eye-tracking module 118 to determine the reference eye position with greater accuracy than the eye's position determined from data captured by the fast eye-tracking system. In various embodiments, the slow eye-tracking system may provide eye-tracking data to eye-tracking module 118 at a lower frequency than the fast eye-tracking system. For example, the slow eye-tracking system may operate less frequently or have a slower response time to conserve power.

Eye-tracking unit 130 may be configured to estimate the orientation of the user's eye. The orientation of the eye may correspond to the direction of the user's gaze within near-eye display 120. The orientation of the user's eye may be defined as the direction of the foveal axis, which is the axis between the fovea (an area on the retina of the eye with the highest concentration of photoreceptors) and the center of the eye's pupil. In general, when a user's eyes are fixed on a point, the foveal axes of the user's eyes intersect that point. The pupillary axis of an eye may be defined as the axis that passes through the center of the pupil and is perpendicular to the corneal surface. In general, even though the pupillary axis and the foveal axis intersect at the center of the pupil, the pupillary axis may not directly align with the foveal axis. For example, the orientation of the foveal axis may be offset from the pupillary axis by approximately −1° to 8° laterally and about ±4° vertically. Because the foveal axis is defined according to the fovea, which is located in the back of the eye, the foveal axis may be difficult or impossible to measure directly in some eye tracking embodiments. Accordingly, in some embodiments, the orientation of the pupillary axis may be detected and the foveal axis may be estimated based on the detected pupillary axis.

In general, the movement of an eye corresponds not only to an angular rotation of the eye, but also to a translation of the eye, a change in the torsion of the eye, and/or a change in the shape of the eye. Eye-tracking unit 130 may also be configured to detect the translation of the eye, which may be a change in the position of the eye relative to the eye socket. In some embodiments, the translation of the eye may not be detected directly, but may be approximated based on a mapping from a detected angular orientation. Translation of the eye corresponding to a change in the eye's position relative to the eye-tracking unit may also be detected. Translation of this type may occur, for example, due to a shift in the position of near-eye display 120 on a user's head. Eye-tracking unit 130 may also detect the torsion of the eye and the rotation of the eye about the pupillary axis. Eye-tracking unit 130 may use the detected torsion of the eye to estimate the orientation of the foveal axis from the pupillary axis. Eye-tracking unit 130 may also track a change in the shape of the eye, which may be approximated as a skew or scaling linear transform or a twisting distortion (e.g., due to torsional deformation). Eye-tracking unit 130 may estimate the foveal axis based on some combinations of the angular orientation of the pupillary axis, the translation of the eye, the torsion of the eye, and the current shape of the eye.

In some embodiments, eye-tracking unit 130 may include multiple emitters or at least one emitter that can project a structured light pattern on all portions or a portion of the eye. The structured light pattern may be distorted due to the shape of the eye when viewed from an offset angle. Eye-tracking unit 130 may also include at least one camera that may detect the distortions (if any) of the structured light pattern projected onto the eye. The camera may be oriented on a different axis to the eye than the emitter. By detecting the deformation of the structured light pattern on the surface of the eye, eye-tracking unit 130 may determine the shape of the portion of the eye being illuminated by the structured light pattern. Therefore, the captured distorted light pattern may be indicative of the 3D shape of the illuminated portion of the eye. The orientation of the eye may thus be derived from the 3D shape of the illuminated portion of the eye. Eye-tracking unit 130 can also estimate the pupillary axis, the translation of the eye, the torsion of the eye, and the current shape of the eye based on the image of the distorted structured light pattern captured by the camera.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect (or the nearest point between the two axes). The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, a virtual reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to VR engine 116.

Headset tracking module 114 may calibrate the artificial reality system environment 100 using one or more calibration parameters, and may adjust one or more calibration parameters to reduce errors in determining the position of near-eye display 120. For example, headset tracking module 114 may adjust the focus of external imaging device 150 to obtain a more accurate position for observed locators on near-eye display 120. Moreover, calibration performed by headset tracking module 114 may also account for information received from IMU 132. Additionally, if tracking of near-eye display 120 is lost (e.g., external imaging device 150 loses line of sight of at least a threshold number of locators 126), headset tracking module 114 may re-calibrate some or all of the calibration parameters.

VR engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. VR engine 116 may also receive estimated eye position and orientation information from eye-tracking module 118. Based on the received information, VR engine 116 may determine content to provide to near-eye display 120 for presentation to the user. For example, if the received information indicates that the user has looked to the left, VR engine 116 may generate content for near-eye display 120 that mirrors the user's eye movement in a virtual environment. Additionally, VR engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

In some embodiments, eye-tracking unit 130 may output eye-tracking data including images of the eye, and eye-tracking module 118 may determine the eye's position based on the images. For example, eye-tracking module 118 may store a mapping between images captured by eye-tracking unit 130 and eye positions to determine a reference eye position from an image captured by eye-tracking unit 130. Alternatively or additionally, eye-tracking module 118 may determine an updated eye position relative to a reference eye position by comparing an image from which the reference eye position is determined to an image from which the updated eye position is to be determined. Eye-tracking module 118 may determine eye position using measurements from different imaging devices or other sensors. For example, as described above, eye-tracking module 118 may use measurements from a slow eye-tracking system to determine a reference eye position, and then determine updated positions relative to the reference eye position from a fast eye-tracking system until a next reference eye position is determined based on measurements from the slow eye-tracking system.

Eye-tracking module 118 may also determine eye calibration parameters to improve precision and accuracy of eye tracking. Eye calibration parameters may include parameters that may change whenever a user dons or adjusts near-eye display 120. Example eye calibration parameters may include an estimated distance between a component of eye-tracking unit 130 and one or more parts of the eye, such as the eye's center, pupil, cornea boundary, or a point on the surface of the eye. Other example eye calibration parameters may be specific to a particular user and may include an estimated average eye radius, an average corneal radius, an average sclera radius, a map of features on the eye surface, and an estimated eye surface contour. In embodiments where light from the outside of near-eye display 120 may reach the eye (as in some augmented reality applications), the calibration parameters may include correction factors for intensity and color balance due to variations in light from the outside of near-eye display 120.

Eye-tracking module 118 may use eye calibration parameters to determine whether the measurements captured by eye-tracking unit 130 would allow eye-tracking module 118 to determine an accurate eye position (also referred to herein as "valid measurements"). Invalid measurements, from which eye-tracking module 118 may not be able to determine an accurate eye position, may be caused by the user blinking, adjusting the headset, or removing the headset, and/or may be caused by near-eye display 120 experiencing greater than a threshold change in illumination due to external light.

Figure 2:
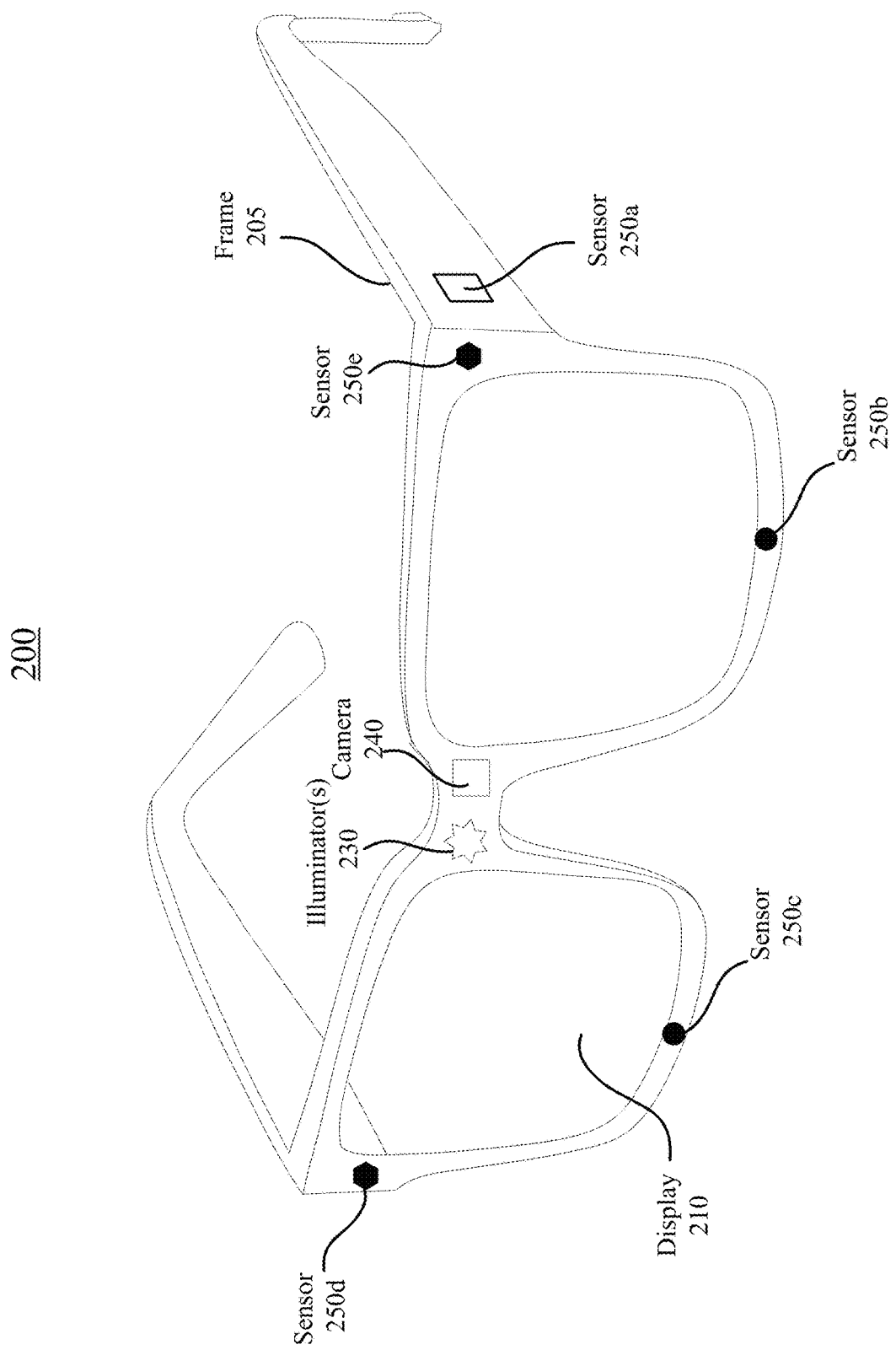
FIG. 2 is a perspective view of a simplified example near-eye display including various sensors.

FIG. 2 is a perspective view of a simplified example near-eye display 200 including various sensors. Near-eye display 200 may be a specific implementation of near-eye display 120 of FIG. 1, and may be configured to operate as a virtual reality display, an augmented reality display, and/or a mixed reality display. Near-eye display 200 may include a frame 205 and a display 210. Display 210 may be configured to present content to a user. In some embodiments, display 210 may include display electronics and/or display optics. For example, as described above with respect to near-eye display 120 of FIG. 1, display 210 may include an LCD display panel, an LED display panel, or an optical display panel (e.g., a waveguide display assembly).

Near-eye display 200 may further include various sensors 250*a*, 250*b*, 250*c*, 250*d*, and 250*e* on or within frame 205. In some embodiments, sensors 250*a*-250*e* may include one or more depth sensors, motion sensors, position sensors, inertial sensors, or ambient light sensors. In some embodiments, sensors 250*a*-250*e* may include one or more image sensors configured to generate image data representing different fields of views in different directions. In some embodiments, sensors 250a-250e may be used as input devices to control or influence the displayed content of near-eye display 200, and/or to provide an interactive VR/AR/MR experience to a user of near-eye display 200. In some embodiments, sensors 250a-250e may also be used for stereoscopic imaging.

In some embodiments, near-eye display 200 may further include one or more illuminators 230 to project light into the physical environment. The projected light may be associated with different frequency bands (e.g., visible light, infra-red light, ultra-violet light, etc.), and may serve various purposes. For example, illuminator(s) 230 may project light in a dark environment (or in an environment with low intensity of infra-red light, ultra-violet light, etc.) to assist sensors 250a-250e in capturing images of different objects within the dark environment. In some embodiments, illuminator(s) 230 may be used to project certain light pattern onto the objects within the environment. In some embodiments, illuminator(s) 230 may be used as locators, such as locators 126 described above with respect to FIG. 1.

In some embodiments, near-eye display 200 may also include a high-resolution camera 240. Camera 240 may capture images of the physical environment in the field of view. The captured images may be processed, for example, by a virtual reality engine (e.g., virtual reality engine 116 of FIG. 1) to add virtual objects to the captured images or modify physical objects in the captured images, and the processed images may be displayed to the user by display 210 for AR or MR applications.

Figure 3:
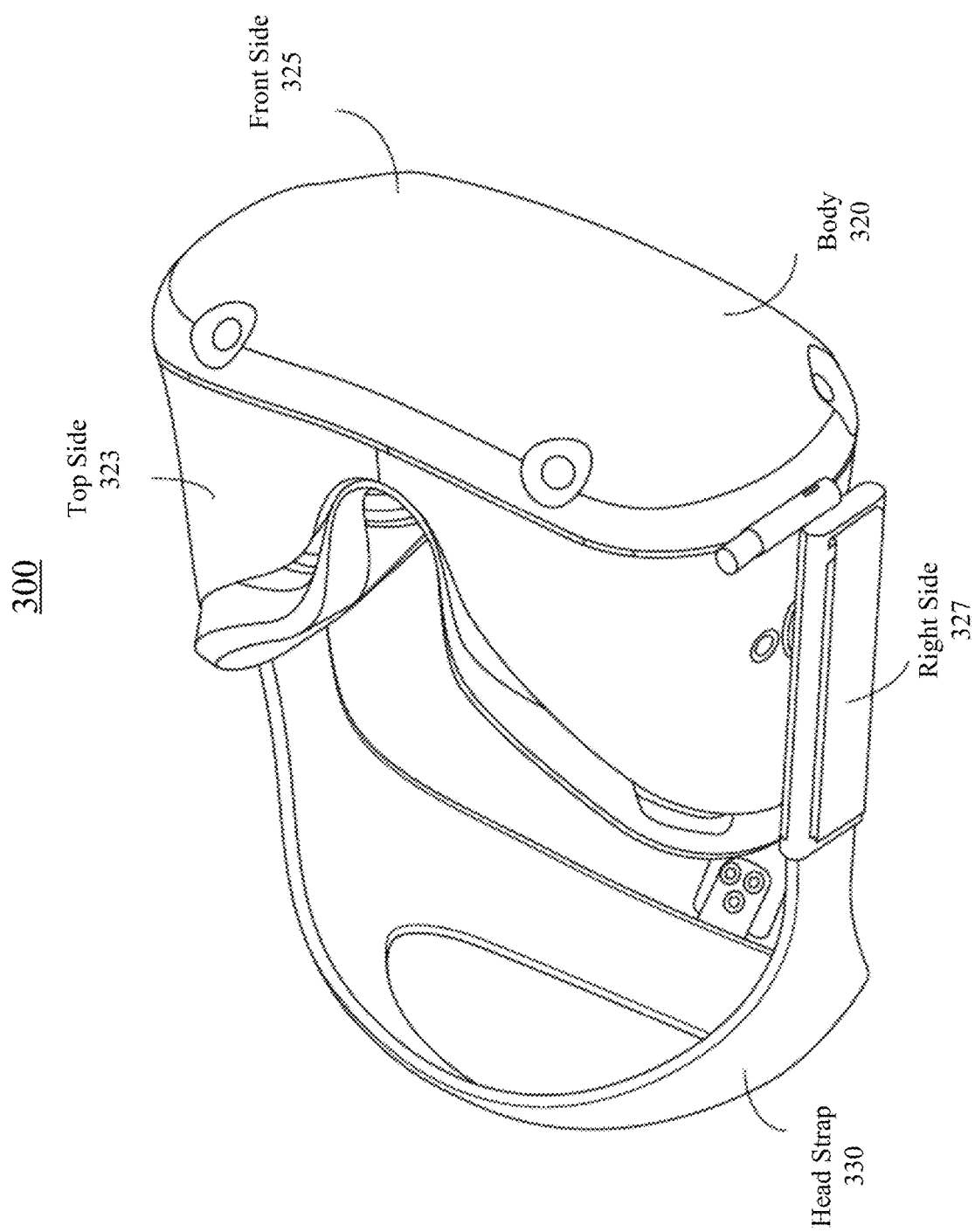
FIG. 3 is a perspective view of an example near-eye display in the form of a head-mounted display (HMD) device for implementing some of the examples disclosed herein.

FIG. 3 is a perspective view of an example near-eye display in the form of a head-mounted display (HMD) device 300 for implementing some of the example near-eye displays (e.g., near-eye display 120) disclosed herein. HMD device 300 may be a part of, e.g., a virtual reality (VR) system, an augmented reality (AR) system, a mixed reality (MR) system, or some combinations thereof. HMD device 300 may include a body 320 and a head strap 330. FIG. 3 shows a top side 323, a front side 325, and a right side 327 of body 320 in the perspective view.

Head strap 330 may have an adjustable or extendible length. There may be a sufficient space between body 320 and head strap 330 of HMD device 300 for allowing a user to mount HMD device 300 onto the user's head. In various embodiments, HMD device 300 may include additional, fewer, or different components. For example, in some embodiments, HMD device 300 may include eyeglass temples and temples tips rather than head strap 330.

HMD device 300 may present to a user media including virtual and/or augmented views of a physical, real-world environment with computer-generated elements. Examples of the media presented by HMD device 300 may include images (e.g., two-dimensional (2D) or three-dimensional (3D) images), videos (e.g., 2D or 3D videos), audio, or some combinations thereof. The images and videos may be presented to each eye of the user by one or more display assemblies (not shown in FIG. 3) enclosed in body 320 of HMD device 300. In various embodiments, the one or more display assemblies may include a single electronic display panel or multiple electronic display panels (e.g., one display panel for each eye of the user). Examples of the electronic display panel(s) may include, for example, a liquid crystal display (LCD), an organic light emitting diode (OLED) display, an inorganic light emitting diode (ILED) display, a micro-LED display, an active-matrix organic light emitting diode (AMOLED) display, a transparent organic light emitting diode (TOLED) display, some other display, or some combinations thereof. HMD device 300 may include two eye box regions.

In some implementations, HMD device 300 may include various sensors (not shown), such as depth sensors, motion sensors, position sensors, and eye tracking sensors. Some of these sensors may use a structured light pattern for sensing. In some implementations, HMD device 300 may include an input/output interface for communicating with a console. In some implementations, HMD device 300 may include a virtual reality engine (not shown) that can execute applications within HMD device 300 and receive depth information, position information, acceleration information, velocity information, predicted future positions, or some combination thereof of HMD device 300 from the various sensors. In some implementations, the information received by the virtual reality engine may be used for producing a signal (e.g., display instructions) to the one or more display assemblies. In some implementations, HMD device 300 may include locators (not shown, such as locators 126) located in fixed positions on body 320 relative to one another and relative to a reference point. Each of the locators may emit light that is detectable by an external imaging device.

Figure 4:
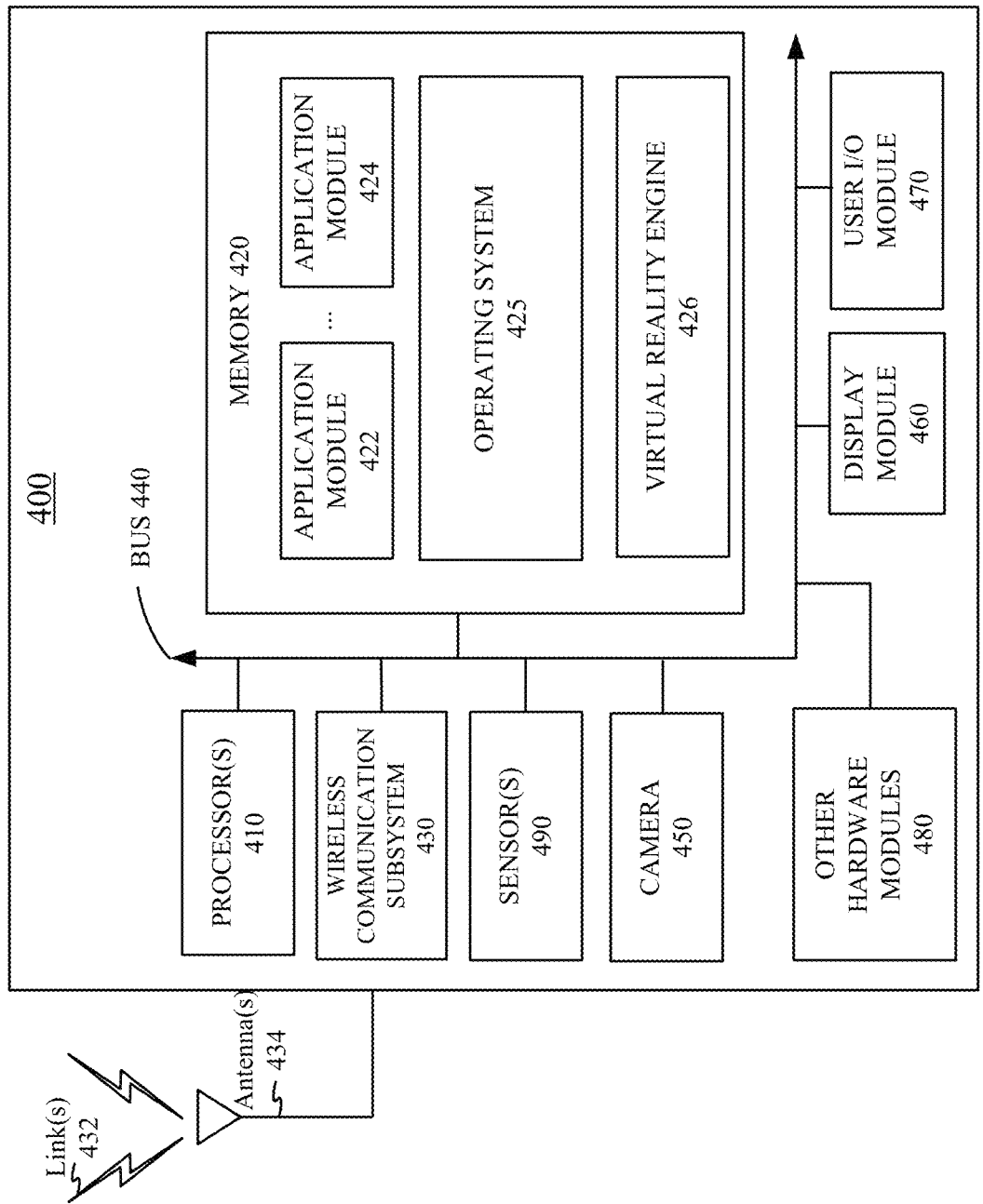
FIG. 4 is a simplified block diagram of an example electronic system of an example near-eye display for implementing some of the examples disclosed herein.

FIG. 4 is a simplified block diagram of an example electronic system 400 of an example near-eye display (e.g., HMD device) for implementing some of the examples disclosed herein. Electronic system 400 may be used as the electronic system of HMD device 300 or other near-eye displays described above. In this example, electronic system 400 may include one or more processor(s) 410 and a memory 420. Processor(s) 410 may be configured to execute instructions for performing operations at a number of components, and can be, for example, a general-purpose processor or microprocessor suitable for implementation within a portable electronic device. Processor(s) 410 may be communicatively coupled with a plurality of components within electronic system 400. To realize this communicative coupling, processor(s) 410 may communicate with the other illustrated components across a bus 440. Bus 440 may be any subsystem adapted to transfer data within electronic system 400. Bus 440 may include a plurality of computer buses and additional circuitry to transfer data.

Memory 420 may be coupled to processor(s) 410. In some embodiments, memory 420 may offer both short-term and long-term storage and may be divided into several units. Memory 420 may be volatile, such as static random access memory (SRAM) and/or dynamic random access memory (DRAM) and/or non-volatile, such as read-only memory (ROM), flash memory, and the like. Furthermore, memory 420 may include removable storage devices, such as secure digital (SD) cards. Memory 420 may provide storage of computer-readable instructions, data structures, program modules, and other data for electronic system 400. In some embodiments, memory 420 may be distributed into different hardware modules. A set of instructions and/or code might be stored on memory 420. The instructions might take the form of executable code that may be executable by electronic system 400, and/or might take the form of source and/or installable code, which, upon compilation and/or installation on electronic system 400 (e.g., using any of a variety of generally available compilers, installation programs, compression/decompression utilities, etc.), may take the form of executable code.

In some embodiments, memory 420 may store a plurality of application modules 422 through 424, which may include any number of applications. Examples of applications may include gaming applications, conferencing applications, video playback applications, or other suitable applications. The applications may include a depth sensing function or eye tracking function. Application modules 422-424 may include particular instructions to be executed by processor(s) 410. In some embodiments, certain applications or parts of application modules 422-424 may be executable by other hardware modules 480. In certain embodiments, memory 420 may additionally include secure memory, which may include additional security controls to prevent copying or other unauthorized access to secure information.

In some embodiments, memory 420 may include an operating system 425 loaded therein. Operating system 425 may be operable to initiate the execution of the instructions provided by application modules 422-424 and/or manage other hardware modules 480 as well as interfaces with a wireless communication subsystem 430 which may include one or more wireless transceivers. Operating system 425 may be adapted to perform other operations across the components of electronic system 400 including threading, resource management, data storage control and other similar functionality.

Wireless communication subsystem 430 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 400 may include one or more antennas 434 for wireless communication as part of wireless communication subsystem 430 or as a separate component coupled to any portion of the system. Depending on desired functionality, wireless communication subsystem 430 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 430 may permit data to be exchanged with a network, other computer systems, and/or any other devices described herein. Wireless communication subsystem 430 may include a means for transmitting or receiving data, such as identifiers of HMD devices, position data, a geographic map, a heat map, photos, or videos, using antenna(s) 434 and wireless link(s) 432. Wireless communication subsystem 430, processor(s) 410, and memory 420 may together comprise at least a part of one or more of a means for performing some functions disclosed herein.

Embodiments of electronic system 400 may also include one or more sensors 490. Sensor(s) 490 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 490 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 400 may include a display module 460. Display module 460 may be a near-eye display, and may graphically present information, such as images, videos, and various instructions, from electronic system 400 to a user. Such information may be derived from one or more application modules 422-424, virtual reality engine 426, one or more other hardware modules 480, a combination thereof, or any other suitable means for resolving graphical content for the user (e.g., by operating system 425). Display module 460 may use liquid crystal display (LCD) technology, light-emitting diode (LED) technology (including, for example, OLED, ILED, micro-LED, AMOLED, TOLED, etc.), light emitting polymer display (LPD) technology, or some other display technology.

Electronic system 400 may include a user input/output module 470. User input/output module 470 may allow a user to send action requests to electronic system 400. An action request may be a request to perform a particular action. For example, an action request may be to start or end an application or to perform a particular action within the application. User input/output module 470 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 400. In some embodiments, user input/output module 470 may provide haptic feedback to the user in accordance with instructions received from electronic system 400. For example, the haptic feedback may be provided when an action request is received or has been performed.

Electronic system 400 may include a camera 450 that may be used to take photos or videos of a user, for example, for tracking the user's eye position. Camera 450 may also be used to take photos or videos of the environment, for example, for VR, AR, or MR applications. Camera 450 may include, for example, a complementary metal-oxide-semiconductor (CMOS) image sensor with a few millions or tens of millions of pixels. In some implementations, camera 450 may include two or more cameras that may be used to capture 3-D images.

In some embodiments, electronic system 400 may include a plurality of other hardware modules 480. Each of other hardware modules 480 may be a physical module within electronic system 400. While each of other hardware modules 480 may be permanently configured as a structure, some of other hardware modules 480 may be temporarily configured to perform specific functions or temporarily activated. Examples of other hardware modules 480 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 480 may be implemented in software.

In some embodiments, memory 420 of electronic system 400 may also store a virtual reality engine 426. Virtual reality engine 426 may execute applications within electronic system 400 and receive position information, acceleration information, velocity information, predicted future positions, or some combination thereof of the HMD device from the various sensors. In some embodiments, the information received by virtual reality engine 426 may be used for producing a signal (e.g., display instructions) to display module 460. For example, if the received information indicates that the user has looked to the left, virtual reality engine 426 may generate content for the HMD device that mirrors the user's movement in a virtual environment. Additionally, virtual reality engine 426 may perform an action within an application in response to an action request received from user input/output module 470 and provide feedback to the user. The provided feedback may be visual, audible, or haptic feedback. In some implementations, processor(s) 410 may include one or more GPUs that may execute virtual reality engine 426.

In various implementations, the above-described hardware and modules may be implemented on a single device or on multiple devices that can communicate with one another using wired or wireless connections. For example, in some implementations, some components or modules, such as GPUs, virtual reality engine 426, and applications (e.g., tracking application), may be implemented on a console separate from the head-mounted display device. In some implementations, one console may be connected to or support more than one HMD.

In alternative configurations, different and/or additional components may be included in electronic system 400. Similarly, functionality of one or more of the components can be distributed among the components in a manner different from the manner described above. For example, in some embodiments, electronic system 400 may be modified to include other system environments, such as an AR system environment and/or an MR environment.

As discussed above, micro-LEDs may be used as light sources in various parts of an artificial reality system, such as the display electronics 122, the locators 126, and the eye tracking unit 130. Further, micro-LEDs may be used in various display technologies, such as heads-up displays, television displays, smartphone displays, watch displays, wearable displays, and flexible displays. Micro-LEDs can be used in combination with a plurality of sensors in many applications such as the Internet of Things (TOT). The micro-LEDs described herein are primarily described as red, blue, or green micro-LEDs; however, the micro-LEDs can be configured to emit light having any desired wavelength, such as ultraviolet or infrared light. Also, the micro-LEDs described herein are primarily described as having parabolic mesas; however, the micro-LEDs can be configured to have any suitable mesa shape, such as planar, vertical, conical, parabolic, or combinations thereof. Further, the micro-LEDs can be configured to have any suitable base shape, such as circular, elliptical, rectangular, triangular, or hexagonal.

Figure 5:
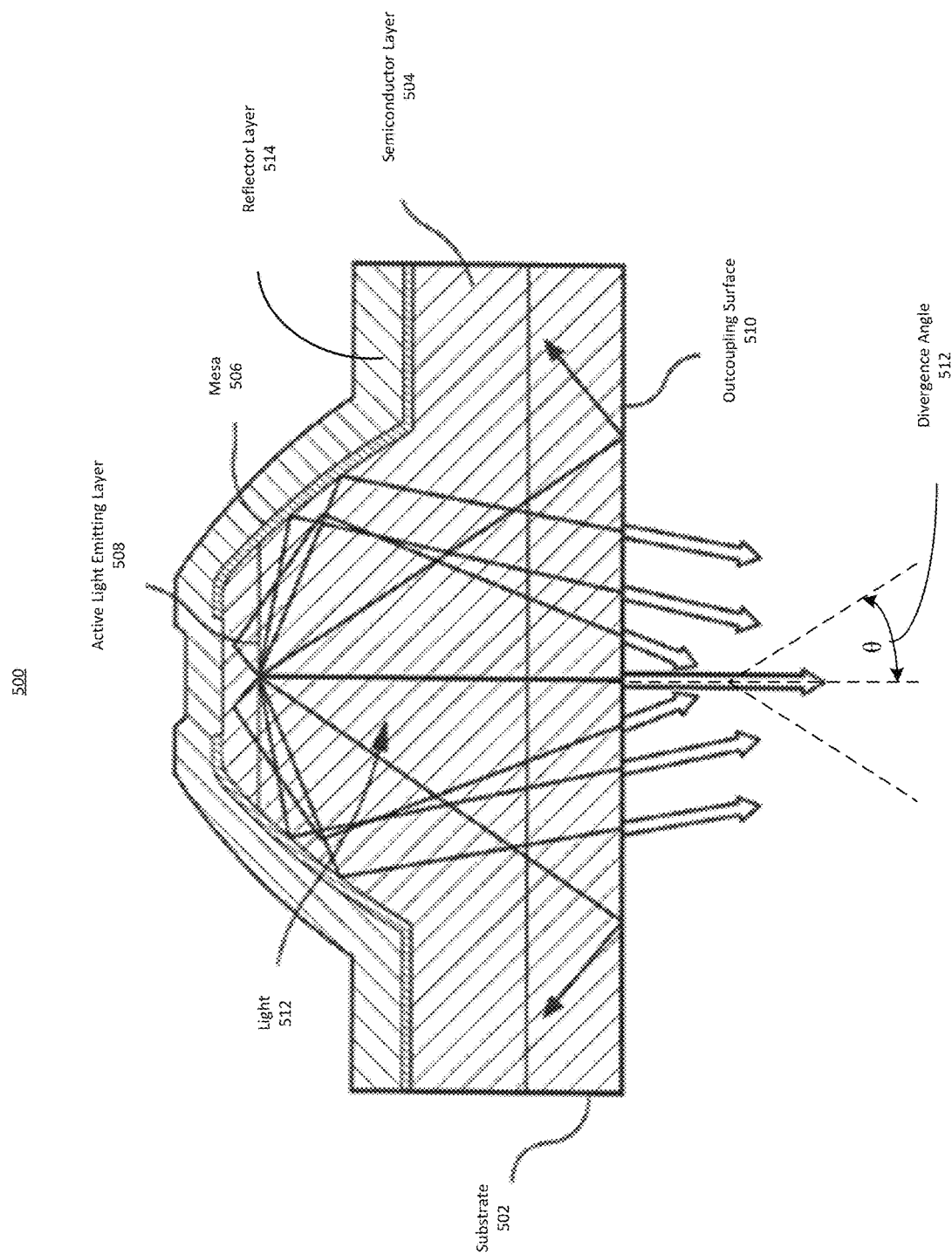
FIG. 5 is a cross sectional view of an example of a micro-LED, according to one or more embodiments.

FIG. 5 is a cross sectional view of an example of a micro-LED 500, according to one or more embodiments. The micro-LED 500 may include a substrate 502, a semiconductor layer 504 shaped into a mesa 506, an active light emitting layer 508, an outcoupling surface 510, and a reflector layer 514. The outcoupling surface 510 of the micro-LED 500 may be less than 20 µm in diameter. A parabolic mesa 506 may be etched onto the LED die during wafer processing to form a quasi-collimated light beam emerging from the outcoupling surface 510. Alternatively, the mesa 506 may have a variety of other shapes, such as planar, vertical, conical, or semi-parabolic. The micro-LED 500 can be configured to have a high light extraction efficiency, and outputs quasi-collimated light because of the shape of the mesa 506. The micro-LED 500 can be configured to emit light having a divergence angle θ in a predetermined range. In various embodiments, the divergence angle θ is approximately 10 degrees.

The semiconductor layer 504 is disposed on the substrate 502. The semiconductor layer 504 and the substrate 502 may be made of the same material, such as GaN. The active light emitting layer 508 is enclosed in the mesa 506. The active light emitting layer 508 may be a multiple quantum well (MQW) layer, and/or may include quantum dots, quantum wires, vertical nano-wires, and/or vertical fins. The active light emitting layer 508 may be arranged at a focal point of the mesa 506. The mesa 506 may have a truncated top on a side opposed to the outcoupling surface 510. The mesa 506 may have a curved or near-parabolic shape to form a reflective enclosure for light within the micro-LED 500. The arrows 512 show how light emitted from the active light emitting layer 508 is reflected off the walls of the mesa 506 toward the outcoupling surface 510 at an angle sufficient for the light to escape the micro-LED 500 (e.g., within the angle of total internal reflection). As discussed in further detail below, a reflector layer 514 may be formed on the mesa 506 to improve the reflection of the light. The p- and n-contacts (not shown) may be located on the same side as the mesa 506, which is opposite the outcoupling surface 510.

Figure 6B:
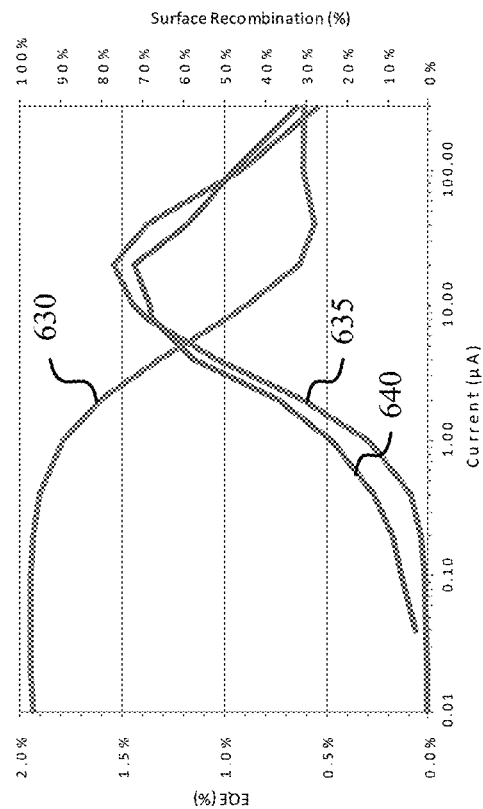
FIG. 6B shows a comparison of experimental data and simulated data for the external quantum efficiency (EQE) of a micro-LED emitting green light, along with the simulated percentage of surface recombination.
Figure 6A:
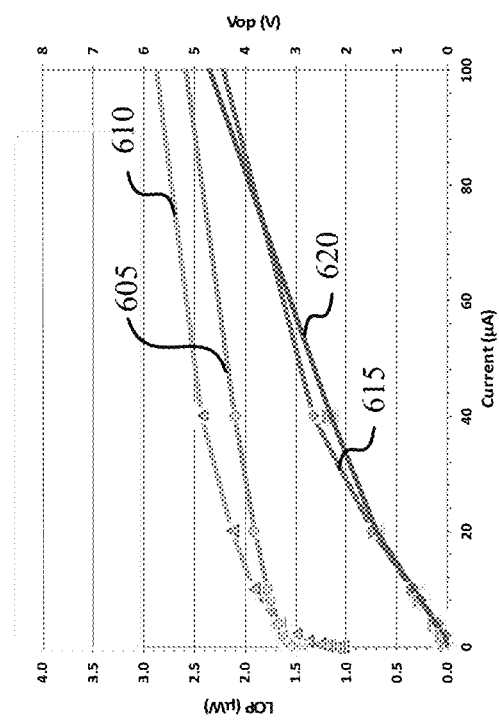
FIG. 6A shows a comparison of experimental data and simulated data for the operating voltage ($V_{op}$) and the light output power (LOP) of a micro-LED emitting green light.

The micro-LED 500 shown in FIG. 5 may be modified to improve the efficiency of the micro-LED 500. Various simulation methods may be used to assess the efficiency. For example, FIGS. 6A and 6B show comparisons of experimental data with simulation data for a micro-LED emitting green light. FIG. 6A shows that simulated operating voltage ($V_{op}$) data 605 agrees well with experimental $V_{op}$ data 610, and that simulated light output power (LOP) data 615 agrees well with experimental LOP data 620. Similarly, FIG. 6B shows that simulated external quantum efficiency (EQE) data 635 agrees well with experimental EQE data 640. FIG. 6B also shows the simulated percentage of surface recombination 630. This illustrates that surface recominbation dominates at the mesa, and shifts the maximum EQE to a higher current of 10-20 µA.

Figure 7B:
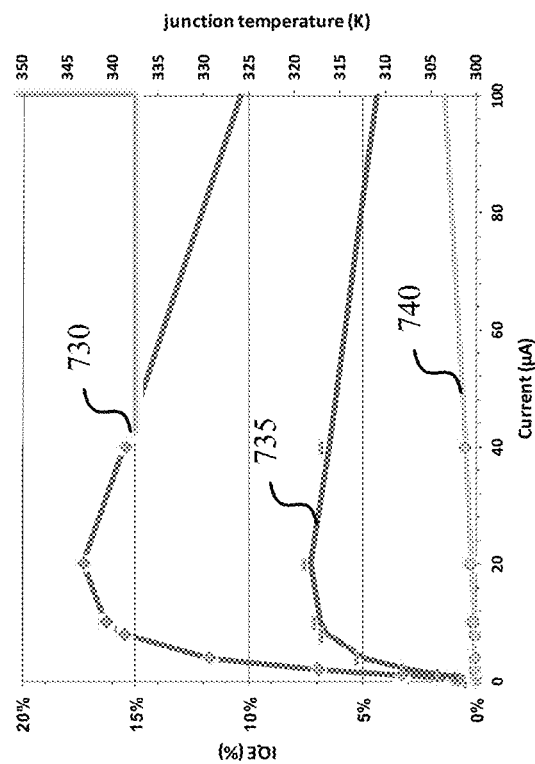
FIG. 7B shows simulated internal quantum efficiency (IQE) data and simulated junction temperature data for a micro-LED emitting green light.
Figure 7A:
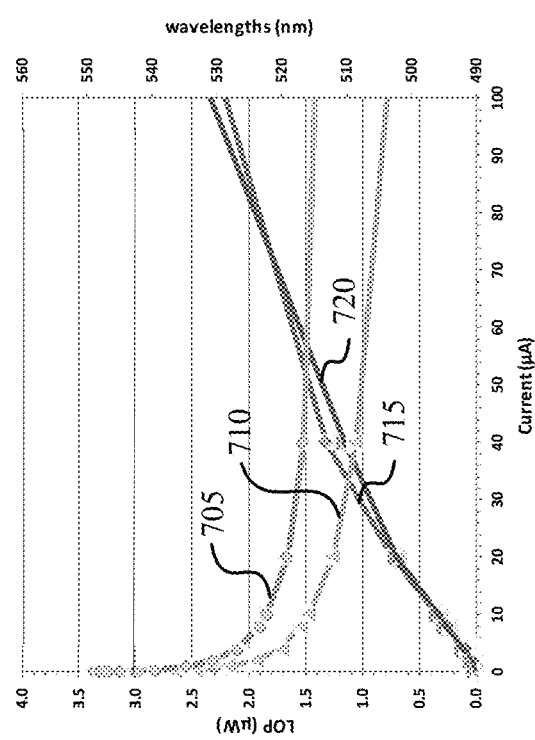
FIG. 7A shows additional comparisons of experimental data with simulation data for a micro-LED emitting green light.

FIG. 7A shows additional comparisons of experimental data with simulation data for a micro-LED emitting green light. FIG. 7A again shows the agreement between simulated LOP data 715 and experimental LOP data 720. In addition, FIG. 7A shows that simulated wavelength data 705 agrees well with experimental wavelength data 710. FIG. 7A illustrates that there is a shift toward blue wavelengths for a green micro-LED emitting light at 515 nm and 10 µA. FIG. 7B shows simulated internal quantum efficiency (IQE) data for a first simulation method 730 and a second simulation method 735, along with simulated junction temperature data 740.

Figure 8B:
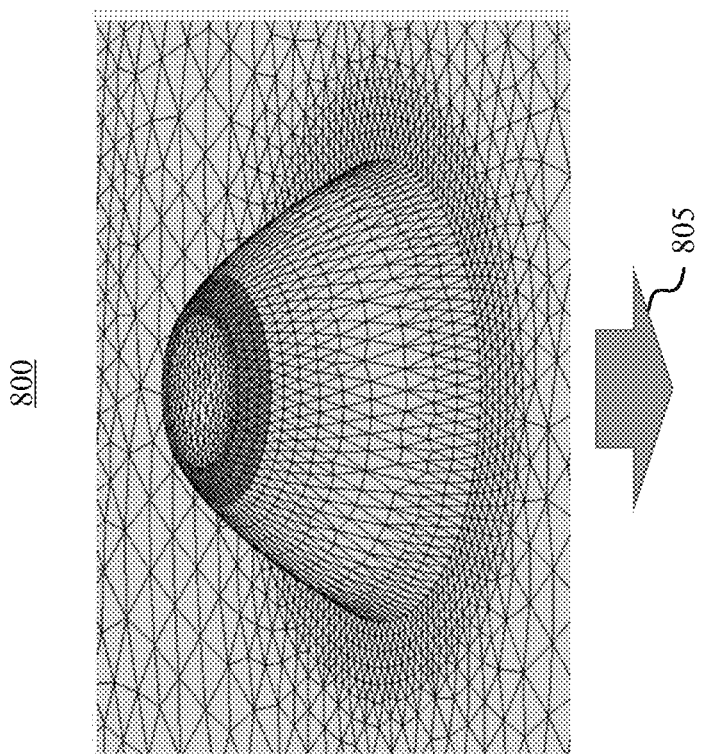
FIG. 8B shows simulated LEE data versus angle for the green micro-LED shown in FIG. 8A.
Figure 8A:
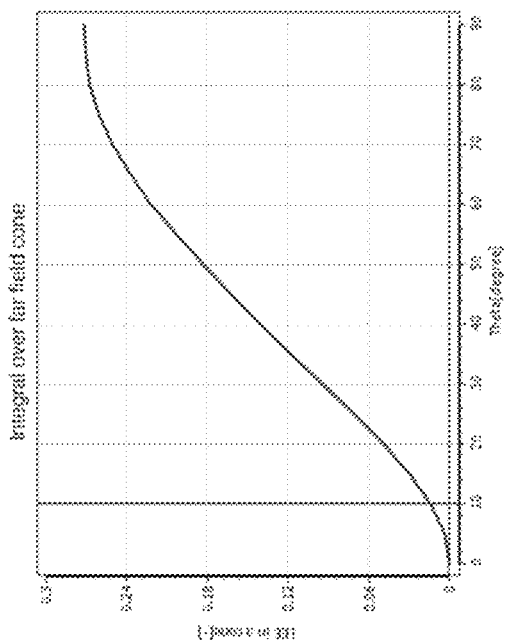
FIG. 8A shows an example of a micro-LED according to one or more embodiments.

FIG. 8A shows an example of a micro-LED 800 according to one or more embodiments. The micro-LED 800 may be similar to the micro-LED 500 shown in FIG. 5. The micro-LED 800 emits light 805 along the direction shown in FIG. 8A. FIG. 8B shows simulated LEE data for the green micro-LED 800 shown in FIG. 8A. As shown in FIG. 8B, the green micro-LED 800 has an LEE of 27.17% within an emission cone having an angle of 90°, and an LEE of 1.43% within an emission cone having an angle of 10°. FIG. 8B illustrates the need to improve the LEE and to emit more light within the narrower emission cone.

Figure 9C:
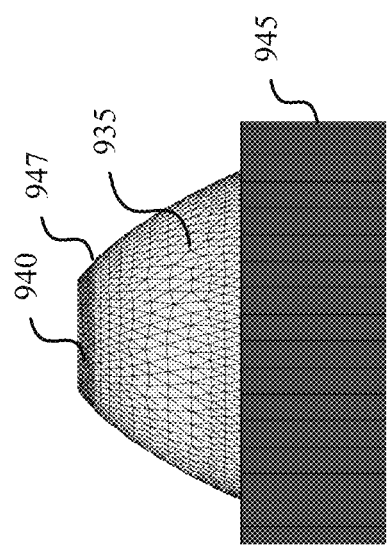
FIGS. 9A-9C show various examples of green micro-LEDs having different mesa shapes from conical to parabolic.
Figure 9B:
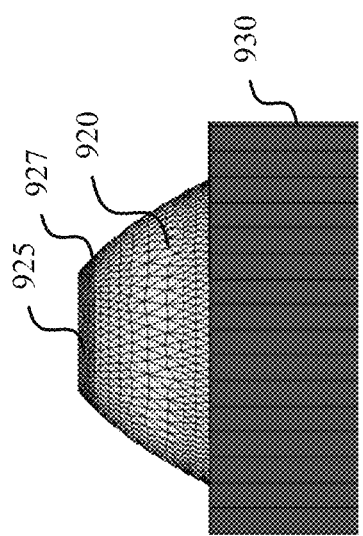
Figure 9A:
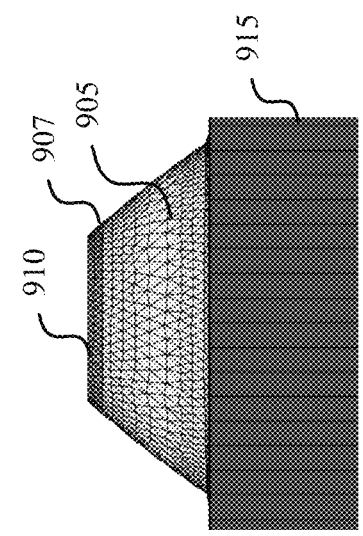

Some embodiments may improve the LEE and the beam profile of a micro-LED by modifying the mesa shape of the micro-LED. FIGS. 9A-9C show various examples of green micro-LEDs having different mesa shapes. The height, width, and/or curvature of the micro-LED may be adjusted to optimize the LEE and the beam profile.

As shown in FIG. 9A, a mesa including an n-side semiconductor 905 and a p-side semiconductor 910 may be arranged on a substrate 915, and a p-contact (not shown) may be provided at the top of the p-side semiconductor 910. An active light emitting layer 907, such as an MQW layer, may be positioned at the interface between the n-side semiconductor 905 and the p-side semiconductor 910. The mesa has a semi-parabolic shape with a height of 1.3 μm and a bottom diameter of 3.5 μm. The micro-LED shown in FIG. 9A has an LEE of 21.17% within an emission cone having an angle of 90°, and an LEE of 0.91% within an emission cone having an angle of 10°.

As shown in FIG. 9B, a mesa including an n-side semiconductor 920 and a p-side semiconductor 925 may be arranged on a substrate 930, and a p-contact (not shown) may be provided at the top of the p-side semiconductor 925. An active light emitting layer 927, such as an MQW layer, may be positioned at the interface between the n-side semiconductor 920 and the p-side semiconductor 925. The mesa has a parabolic shape with a height of 1.3 μm and a bottom diameter of 3.0 μm. The micro-LED shown in FIG. 9B has an LEE of 27.17% within an emission cone having an angle of 90°, and an LEE of 1.43% within an emission cone having an angle of 10°.

As shown in FIG. 9C, a mesa including an n-side semiconductor 935 and a p-side semiconductor 940 may be arranged on a substrate 945, and a p-contact (not shown) may be provided at the top of the p-side semiconductor 940. Alternatively, the mesa may be arranged on a thin current spreading layer having a typical thickness between 2 and 8 μm, in which case the substrate has been removed. The mesa has a parabolic shape with a height of 1.5 μm and a bottom diameter of 3.0 μm. The micro-LED shown in FIG. 9C has an improved LEE of 31.21% within an emission cone having an angle of 90°, and an LEE of 1.62% within an emission cone having an angle of 10°. A comparison of FIGS. 9A-9C illustrates that the LEE and beam profile of a micro-LED can be improved by using a mesa with a parabolic shape instead of a semi-parabolic shape, and by increasing the height of the mesa. Inductively coupled plasma (ICP) etching may be used as a high-accuracy method to form the desired mesa shape.

Figure 10C:
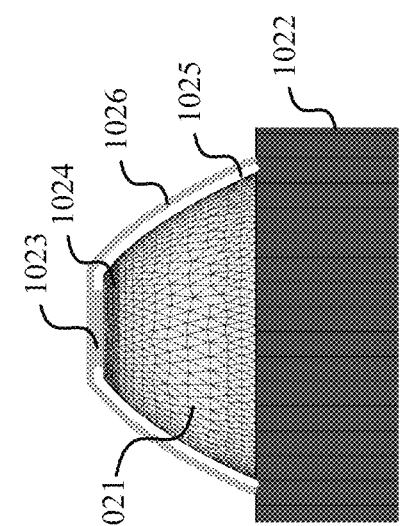
FIGS. 10A-10C show various examples of green micro-LEDs having different reflector layers.
Figure 10B:
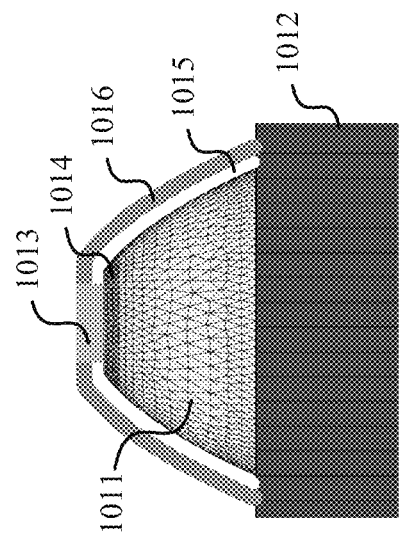
Figure 10A:
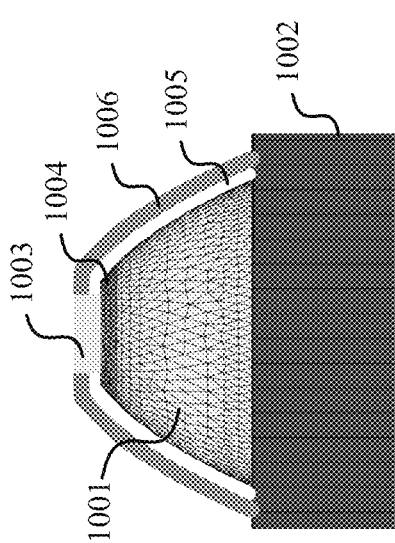

Alternatively or in addition, some embodiments may improve the LEE and the beam profile of a micro-LED by providing a reflector layer on an outer surface of the mesa of the micro-LED. FIGS. 10A-10C show various examples of green micro-LEDs having different reflector layers. For example, the reflector layer may include different sub-layers having different materials and different thicknesses. Also, different reflector layers may be provided for the mesa and the p-contact. Alternatively, the reflector layer may be used with no other layers by using the large difference in refractive index between the semiconductor material and air.

As shown in FIG. 10A, a mesa including an n-side semiconductor 1001 and a p-side semiconductor 1004 may be arranged on a substrate 1002, and a p-contact 1003 may be provided at the top of the p-side semiconductor 1004. A first reflector layer that is formed on an outer surface of the mesa may include an SiN layer 1005 and a layer 1006 including, in order from the SiN layer 1005, Ti and Au. The SiN layer 1005 may have a thickness between 100 nm and 400 nm, such as 200 nm. The Ti layer may have a thickness between 1 nm and 30 nm, such as 20 nm. The Au layer may have a thickness between 100 nm and 500 nm, such as 300 nm. The p-contact 1003 that is formed on an outer surface of the p-semiconductor 1004 may include in order from the p-side semiconductor 1004, a Ni layer and an Au layer. The Ni layer may have a thickness between 5 nm and 30 nm, such as 20 nm. The Au layer may have a thickness between 20 nm and 330 nm, such as 300 nm. The micro-LED shown in FIG. 10A has an LEE of 31.21% within an emission cone having an angle of 90°, and an LEE of 1.62% within an emission cone having an angle of 10°.

As shown in FIG. 10B, a mesa including an n-side semiconductor 1011 and a p-side semiconductor 1014 may be arranged on a substrate 1012, and a p-contact 1013 may be provided at the top of the p-side semiconductor 1014. A first reflector layer that is formed on an outer surface of the mesa may include an SiN layer 1015 and a layer 1016 including, in order from the SiN layer 1015, Ti and Au. The SiN layer 1015 may have a thickness between 100 nm and 400 nm, such as 200 nm. The Ti layer may have a thickness between 1 nm and 30 nm, such as 20 nm. The Au layer may have a thickness between 100 nm and 500 nm, such as 300 nm. The p-contact 1013 that is formed on an outer surface of the p-side semiconductor 1014 may include, in order from the p-side semiconductor 1014, an Ag layer, a Pt layer, and an Au layer. The Ag layer may have a thickness between 90 nm and 300 nm, such as 100 nm. The Pt layer may have a thickness between 20 nm and 50 nm, such as 25 nm. The Au layer may have a thickness between 100 nm and 500 nm, such as 300 nm. The micro-LED shown in FIG. 10B has an LEE of 35.2% within an emission cone having an angle of 90°, and an LEE of 1.9% within an emission cone having an angle of 10°.

As shown in FIG. 10C, a mesa including an n-side semiconductor 1021 and a p-side semiconductor 1024 may be arranged on a substrate 1022, and a p-contact 1023 may be provided at the top of the p-side semiconductor 1024. A first reflector layer that is formed on an outer surface of the mesa may include an SiN layer 1025 and a layer 1026 including, in order from the SiN layer 1025, Ag, Pt, and Au. The SiN layer 1025 may have a reduced thickness between 40 nm and 100 nm, such as 75 nm. The Ag layer may have a thickness between 60 nm and 150 nm, such as 100 nm. The Pt layer may have a thickness between 20 nm and 30 nm, such as 25 nm. The Au layer may have a thickness between 100 nm and 200 nm, such as 125 nm. The p-contact 1023 that is formed on an outer surface of the p-side semiconductor 1024 may include, in order from the p-side semiconductor 1024, an Ag layer, a Pt layer, and an Au layer. The Ag layer may have a thickness between 60 nm and 150 nm, such as 100 nm. The Pt layer may have a thickness between 20 nm and 30 nm, such as 25 nm. The Au layer may have a thickness between 110 nm and 140 nm, such as 125 nm. The micro-LED shown in FIG. 10C has an LEE of 50.1% within an emission cone having an angle of 90°, and an LEE of 2.65% within an emission cone having an angle of 10°. The thin reflector design shown in FIG. 10C may be optimized for a high reflectivity with thin layer stacks and a very close pitch (such as less than 5 μm) of many micro-LEDs in one- or two-dimensional arrays, such as for super resolution 1-4K display applications.

Although specific materials having specific thicknesses are described above, the reflector layers may include any suitable materials having any suitable thicknesses. The materials and their thicknesses may be chosen based on the desired emission wavelength and the semiconductor material. Further, the materials and their thicknesses may be chosen in order to achieve specific outcomes. For example, with reference to the micro-LED shown in FIG. 10C, the SiN layer 1025 may be configured to serve as a dielectric passivation layer that prevents shortage of the p/n junction and avoids resonance, such as resonant absorption, within the optical cavity. The SiN may be replaced with any suitable dielectric material, such as $SiO_2$, HfO, or AlO. The Ag layer within layer 1026 may be configured to serve as an adhesion layer that also provides reflectivity. The Ag should not be replaced with an adhesion metal having a high light absorption, such as Ti, due to the high light absorption even for small layer thickness of 10-20 nm. The Pt layer within layer 1026 may be configured to serve as a diffusion barrier layer that reduces interdiffusion between various layers. The Pt layer may also serve as a protective layer for the Ag layer and to avoid oxidation. The Au layer within layer 1026 may be configured to serve as an additional coating and protection layer.

Further, with reference to the micro-LED shown in FIG. 10C, materials and thicknesses of the p-contact 1023 may be chosen based on the desired emission wavelength and the semiconductor material. Further, the materials and their thicknesses may be chosen in order to achieve specific outcomes. For example, the Ag layer may be replaced by an Al layer for green or blue micro-LEDs, and the Ag layer may be replaced by an Au layer for red or IR micro-LEDs. In addition, the Pt layer may be replaced by another diffusion barrier layer, such as a Pd, WTi, or WN layer. Further, the Au layer may be replaced by an Al layer.

Figure 11B:
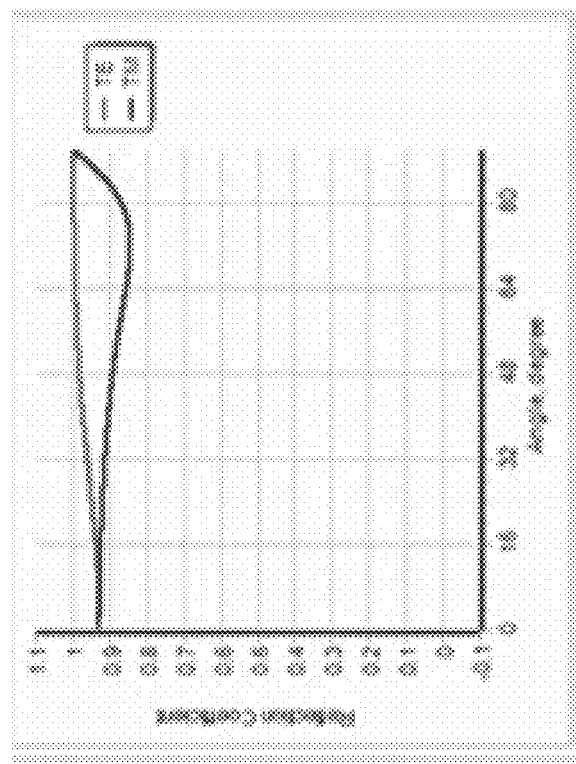
FIGS. 11A and 11B show wave optic calculations, including coherent effects, of reflection coefficients versus incident angle of light of different examples of green micro-LEDs.
Figure 11A:
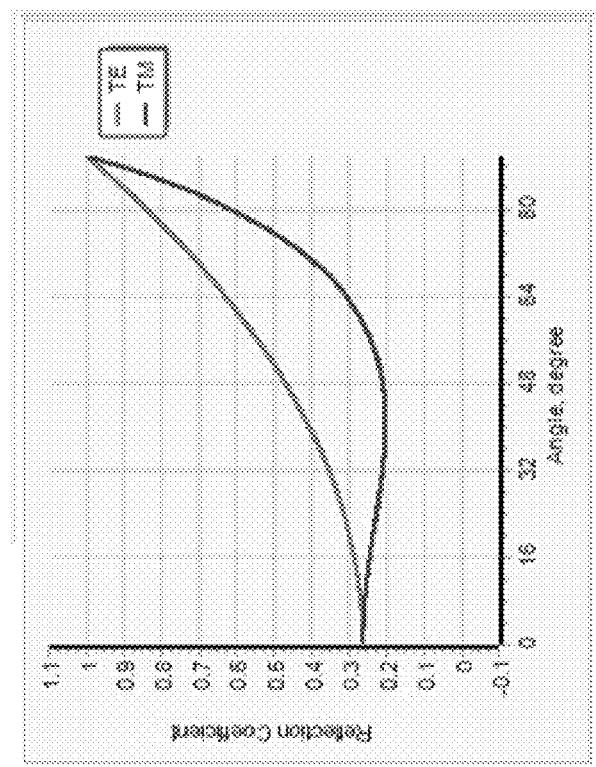

FIGS. 11A and 11B show reflection coefficients for a typical reflector design and an optimized reflector design, respectively, of green micro-LEDs. For example, FIG. 11A shows the transverse electric (TE) and transverse magnetic (TM) coefficients as a function of angle for the green micro-LED shown in FIG. 10B. Similarly, FIG. 11B shows the TE and TM coefficients as a function of angle for the green micro-LED shown in FIG. 10C. As shown in FIGS. 11A and 11B, the reflective layers in the green micro-LED shown in FIG. 10C achieve a significantly higher reflection, which leads to a higher LEE.

Some embodiments may improve the LEE and the beam profile of a micro-LED by incorporating an anti-reflection coating on the outcoupling surface of the micro-LED, providing an index-matched material between the outcoupling surface of the micro-LED and a downstream optical element, and/or providing secondary optics on the outcoupling surface of the micro-LED. FIGS. 12A-12C show various examples of green micro-LEDs having different components to optimize the LEE and the beam profile.

As shown in FIG. 12A, a mesa including an n-side semiconductor 1201 and a p-side semiconductor 1204 may be arranged on a substrate 1202, and a p-contact 1215 may be provided at the top of the p-side semiconductor 1204. Alternatively, the mesa may be arranged on an n-current spreading layer without a substrate. A reflector layer that is formed on an outer surface of the mesa may include a layer 1205 and a layer 1206. An optical element 1211 may receive light 1210 from an outcoupling surface 1208 of the substrate 1202. An anti-reflection coating 1209 may be arranged on the outcoupling surface 1208. The micro-LED shown in FIG. 12A has an LEE of 52.2% within an emission cone having an angle of 90°, and an LEE of 2.96% within an emission cone having an angle of 10°. The micro-LED shown in FIG. 12A uses the micro-LED shown in FIG. 10C, but adds the anti-reflection coating 1209 and provides light to the optical element 1211.

As shown in FIG. 12B, a mesa including an n-side semiconductor 1221 and a p-side semiconductor 1224 may be arranged on an n-current spreading substrate 1222, and a p-contact 1235 may be provided at the top of the p-side semiconductor 1224. A reflector layer that is formed on an outer surface of the mesa may include a layer 1225 and a layer 1226. An optical element 1231 may receive light 1230 from an outcoupling surface 1228 of the substrate 1222. An index-matched material 1229 may be arranged between the outcoupling surface 1228 and the optical element 1231. An index of refraction of the index-matched material 1229 may be greater than 1, and/or greater than or equal to an index of refraction of the optical element 1231. For example, if the optical element 1231 has an index of refraction of 1.5, the index-matched material 1229 may have an index of refraction between 1.5 and 1.7. In other examples, the index-matched material 1229 may have an index of refraction up to 2.2. The index-matched material 1229 may be made of any suitable material, such as silicone. The micro-LED shown in FIG. 12A has an LEE of 81.1% within an emission cone having an angle of 90°, and an LEE of 5.94% within an emission cone having an angle of 10°. The micro-LED shown in FIG. 12B uses the micro-LED shown in FIG. 10C, but adds the index-matched material 1229 and provides light to the optical element 1231.

As shown in FIG. 12C, a mesa including an n-side semiconductor 1241 and a p-side semiconductor 1244 may be arranged on an n-current spreading substrate 1242, and a p-contact 1255 may be provided at the top of the p-side semiconductor 1244. A reflector layer that is formed on an outer surface of the mesa may include a layer 1245 and a layer 1246. An optical element 1251 may receive light 1250 from an outcoupling surface 1248 of the substrate 1242.

Secondary optics 1252 may be arranged between the outcoupling surface 1248 and the optical element 1251. For example, the secondary optics 1252 may be a lens. The lens may be a separate optical component, or may be etched into the outcoupling surface 1248. The lens may have a focal point at an active emitting layer of the micro-LED. FIG. 12C shows a measured beam profile 1254 and a simulated beam profile 1253. The micro-LED shown in FIG. 12C uses the micro-LED shown in FIG. 10C, but adds the secondary optics 1252 and provides light to the optical element 1251.

Figure 13A:
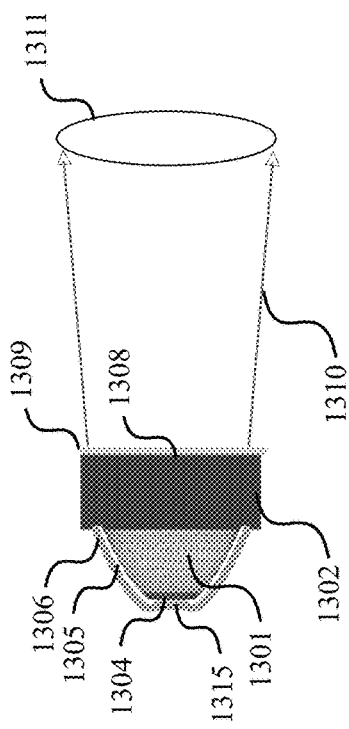
FIGS. 13A-13C show various examples of red micro-LEDs having different components on the outcoupling surface to optimize the LEE and the beam profile.
Figure 13B:
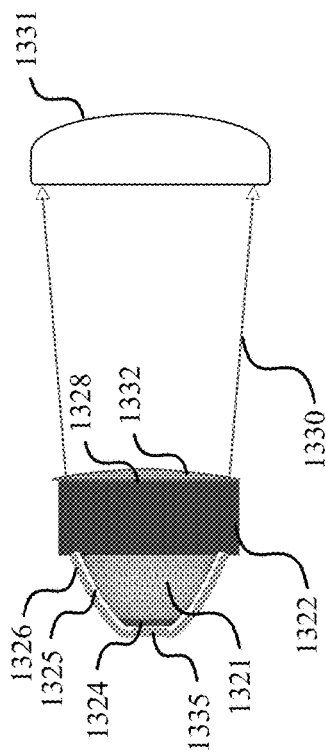
Figure 13C:
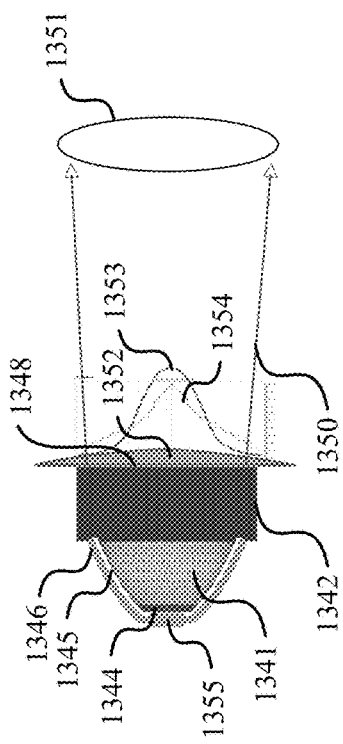

FIGS. 13A-13C show various examples of red micro-LEDs having different components to optimize the LEE and the beam profile. As shown in FIG. 13A, a mesa including an n-side semiconductor 1301 and a p-side semiconductor 1304 may be arranged on a substrate 1302, and a p-contact 1315 may be provided at the top of the p-side semiconductor 1304. A reflector layer that is formed on an outer surface of the mesa may include a layer 1305 and a layer 1306. An optical element 1311 may receive light 1310 from an outcoupling surface 1308 of the substrate 1302. An anti-reflection coating 1309 may be arranged on the outcoupling surface 1308. The micro-LED shown in FIG. 13A has an LEE of 30.5% within an emission cone having an angle of 90°, and an LEE of 1.5% within an emission cone having an angle of 10°. The optical element 1311 may have a corresponding acceptance angle of 10°.

As shown in FIG. 13B, a mesa including an n-side semiconductor 1321 and a p-side semiconductor 1324 may be arranged on a substrate 1322, and a p-contact 1335 may be provided at the top of the p-side semiconductor 1324. A reflector layer that is formed on an outer surface of the mesa may include a layer 1325 and a layer 1326. An optical element 1331 may receive light 1330 from an outcoupling surface 1328 of the substrate 1322. Secondary optics 1332 may be arranged between the outcoupling surface 1328 and the optical element 1331. For example, the secondary optics 1332 may be a lens. The lens may be a separate optical component, or may be etched into the outcoupling surface 1328. The lens may have a focal point at an active emitting layer of the micro-LED. In the example shown in FIG. 13B, the lens is a spherical lens whose diameter is approximately equal to the diameter of the outcoupling surface 1328. The micro-LED shown in FIG. 13B has an LEE of 61.0% within an emission cone having an angle of 90°, and an LEE of 2.2% within an emission cone having an angle of 10°. The optical element 1331 may have a corresponding acceptance angle of 10°.

As shown in FIG. 13C, a mesa including an n-side semiconductor 1341 and a p-side semiconductor 1344 may be arranged on a substrate 1342, and a p-contact 1355 may be provided at the top of the p-side semiconductor 1344. A reflector layer that is formed on an outer surface of the mesa may include a layer 1345 and a layer 1346. An optical element 1351 may receive light 1350 from an outcoupling surface 1348 of the substrate 1342. Secondary optics 1352 may be arranged between the outcoupling surface 1348 and the optical element 1351. For example, the secondary optics 1352 may be a lens. The lens may be a separate optical component, such as a resist including a polymer such as Poly(methyl acrylate) (PMA) or glass, or may be etched into the outcoupling surface 1348. The lens may have a focal point at an active emitting layer of the micro-LED. In the example shown in FIG. 13C, the lens is a spherical lens whose diameter is greater than to the diameter of the outcoupling surface 1328. FIG. 12C shows a measured beam profile 1354 and a simulated beam profile 1353. The micro-LED shown in FIG. 13C has an LEE of 76.2% within an emission cone having an angle of 90°, and an LEE of 3.4% within an emission cone having an angle of 10°. The optical element 1531 may have a corresponding acceptance angle of 10°.

Figure 14A:
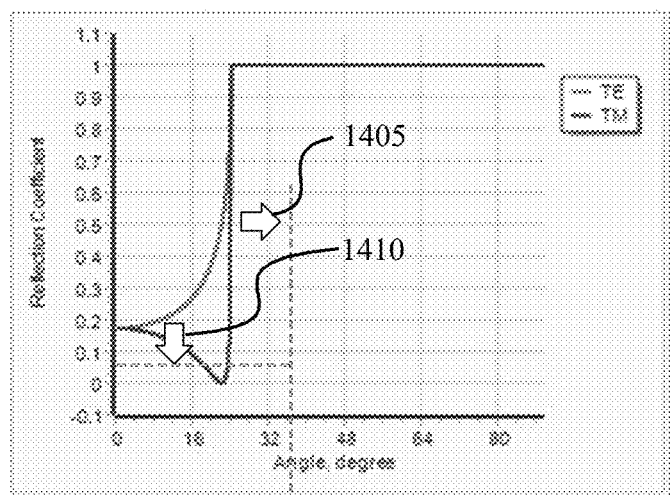
FIGS. 14A and 14B show the effects of incorporating an index-matched material between the outcoupling surface and the optical element for a green micro-LED.
Figure 14B:
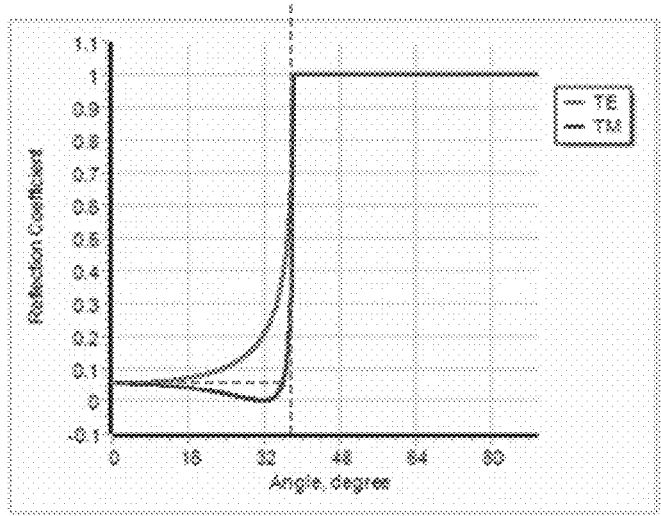

FIGS. 14A and 14B show the effects of incorporating an index-matched material between the outcoupling surface and the optical element for a green micro-LED. FIG. 14A shows the reflection coefficient at the outcoupling surface to air (n=1) for a green micro-LED without the index-matched material, while FIG. 14B shows the reflection coefficient at the outcoupling surface for a green micro-LED with the index-matched material (for example, n=1.5 for typical silicone materials). The arrow 1405 in FIG. 14A indicates an increase in the angle of the emission cone, while the arrow 1410 in FIG. 14B indicates a decrease in the reflection coefficient at the outcoupling surface. Because the reflectivity decreases at the outcoupling surface, and the total internal reflection (TIR) angle shifts to higher wavelengths, the micro-LED has improved light out-coupling and improved light emission into a narrow cone. Accordingly, incorporating the index-matched material improves the light out-coupling from the chip, and directs more light into the emission cone having an angle of 10°.

The index-matched material may be incorporated into micro-LEDs in various applications. For example, a high coupling efficiency may be achieved by butt-coupling the index-matched material to an optical element that is a waveguide that may be used in display and/or projection systems. The waveguide may be an ultra-thin and/or flexible waveguide, and may include a volume Bragg grating (VBG) or a surface relief grating (SRG) as passive beam shaping features. The index-matched material may also be incorporated into micro-LEDs that are used in one-dimensional and/or two-dimensional displays, including displays that use scanning, microelectromechanical systems (MEMS), gratings, liquid crystal displays (LCDs), and/or liquid crystal on silicon (LCOS) displays.

FIGS. 15A-15C show various examples of red micro-LEDs having different secondary optics to optimize the LEE and the beam profile. As shown in FIG. 15A, a mesa including an n-side semiconductor 1502 and a p-side semiconductor 1501 may be arranged on a substrate 1503. The micro-LED shown in FIG. 15A does not include any secondary optics at the outcoupling surface 1507 of the substrate 1503. FIG. 15A shows the measured beam profile 1504 of the micro-LED.

As shown in FIG. 15B, a mesa including an n-side semiconductor 1512 and a p-side semiconductor 1511 may be arranged on a substrate 1513. The micro-LED shown in FIG. 15B includes secondary optics 1516 at the outcoupling surface 1517 of the substrate 1503. In this example, the secondary optics 1516 is a spherical lens. FIG. 15A shows the measured beam profile 1515 and the simulated beam profile 1514 of the micro-LED.

As shown in FIG. 15C, a mesa including an n-side semiconductor 1522 and a p-side semiconductor 1521 may be arranged on a substrate 1523. The micro-LED shown in FIG. 15C includes secondary optics 1526 at the outcoupling surface 1527 of the substrate 1523. In this example, the secondary optics 1526 is a Fresnel lens. FIG. 15C shows the measured beam profile 1525 and the simulated beam profile 1524 of the micro-LED. As shown in FIG. 15C, the Fresnel lens shown in this example having a different focal point in the center and the outer areas causes more light to be emitted into an emission cone having a narrower angle.

Figure 16B:
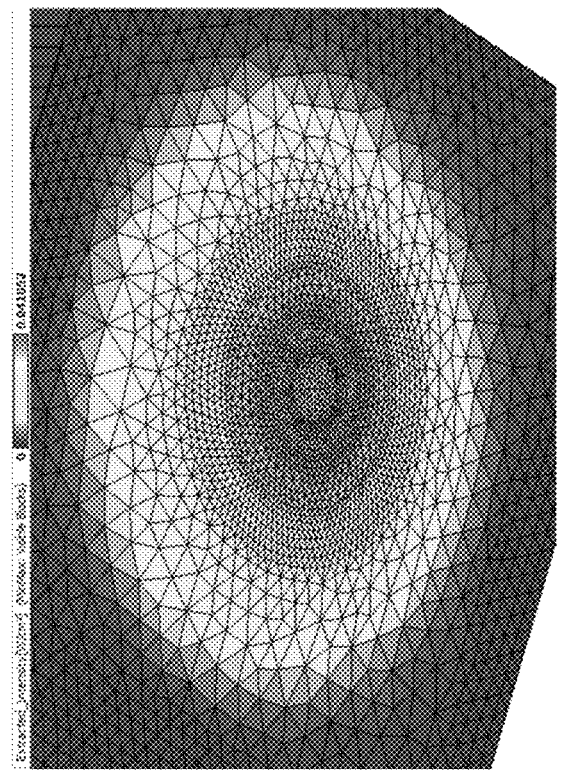
FIGS. 16A and 16B show an example of a green micro-LED having secondary optics to optimize the LEE and the beam profile.
Figure 16A:
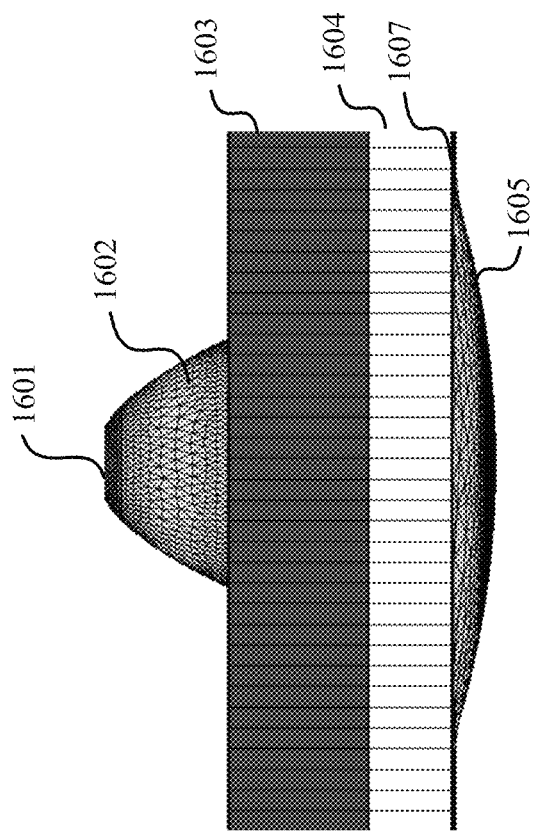

FIGS. 16A and 16B show an example of a green micro-LED having secondary optics to optimize the LEE and the beam profile. As shown in FIG. 16A, a mesa including an n-side semiconductor 1602 and a p-side semiconductor 1601 may be arranged on a substrate including a first layer 1603 and a second layer 1604. The first layer 1603 and the second layer 1604 may be made of the same material, such as 60% AlGaAs. The micro-LED shown in FIG. 16A includes secondary optics 1605 at the outcoupling surface 1607 of the substrate. In this example, the secondary optics 1605 is a spherical lens. The focal point of the spherical lens may be at the active light emitting layer of the micro-LED. Further, an anti-reflection coating may be arranged on an outer surface of the spherical lens, in order to reduce any Fresnel losses. In this example, the mesa has a height of 1.5 µm and the spherical lens has a height of 0.5 µm. FIG. 16B shows the intensity of the beam profile of light emitted by the micro-LED shown in FIG. 16A. The micro-LED shown in FIG. 13C has an LEE of 76.2% within an emission cone having an angle of 90°, and an LEE of 3.4% within an emission cone having an angle of 10°. If a smaller spherical lens is used, such as a spherical lens with a height of 0.3 µm, the LEE decreases to 61.0% within an emission cone having an angle of 90°, and the LEE decreases to 2.2% within an emission cone having an angle of 10°.

Figures 17A, 17B:
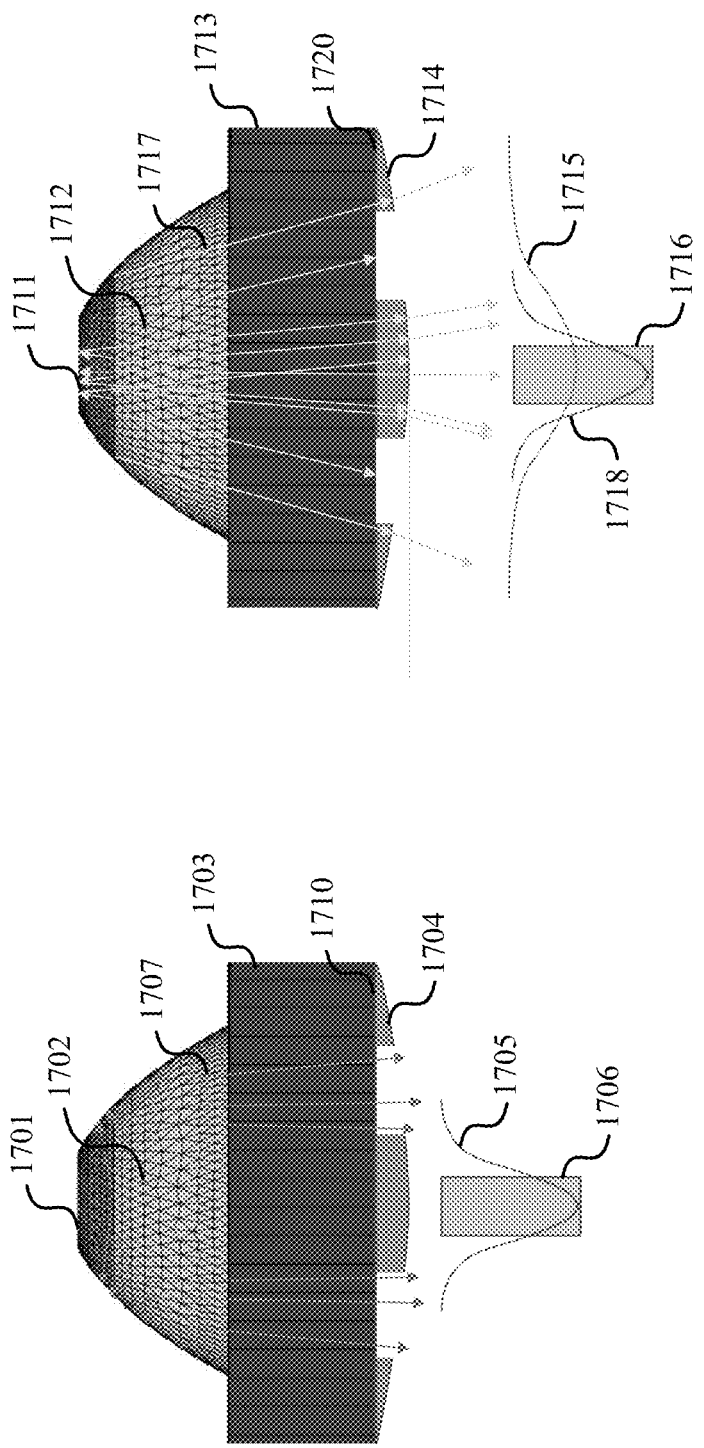
FIGS. 17A and 17B show examples of red and green micro-LEDs having secondary optics to optimize the LEE and the beam profile.

FIGS. 17A and 17B show examples of red and green micro-LEDs having secondary optics to optimize the LEE and the beam profile. As shown in FIG. 17A, a mesa including an n-side semiconductor 1702 and a p-side semiconductor 1701 may be arranged on a substrate 1703. The red micro-LED shown in FIG. 17A includes secondary optics 1704 at the outcoupling surface 1710 of the substrate 1703. In this example, the secondary optics 1704 is a spherical lens with partial openings. The focal point of the lens may be at the active light emitting layer of the micro-LED. Light 1707 emitted from the active light emitting layer forms a beam profile 1705, and may be shaped to approximate a top-hat beam profile 1706. As shown in FIG. 17A, the light 1707 is reflected at the mesa facet and is incident on the outcoupling surface 1710 within a narrow emission cone.

As shown in FIG. 17B, a mesa including an n-side semiconductor 1712 and a p-side semiconductor 1711 may be arranged on a substrate 1713. The green micro-LED shown in FIG. 17B includes secondary optics 1714 at the outcoupling surface 1720 of the substrate 1713. In this example, the secondary optics 1714 is a spherical lens with partial openings. The focal point of the lens may be at the active light emitting layer of the micro-LED. Light 1717 emitted from the active light emitting layer forms a Lambertian beam profile 1715 without lens (HWHM=60°), which is wider than the beam profile 1706 (HWHM<60°) shown in FIG. 17A. The beam profile of light 1717 can be improved with a lens as shown in FIG. 17B and reproduced in FIG. 17B as beam profile 1718 similar to 1705, which both approximate a top-hat beam profile 1716. As shown in FIG. 17B, the light 1717 includes forward travelling and backward reflected light that is incident on the outcoupling surface 1720 within a narrow emission cone 1718. Without additional secondary optics, the beam profile 1715 of the group of green rays within the micro-LED shown in FIG. 17B has a more Lambertian shape than the narrower beam profile 1705 of the group of red rays reflected at the mesa facet within the micro-LED having the same structure shown in FIG. 17A.

FIGS. 18A-18H show examples of a red micro-LED having secondary optics to optimize the LEE and the beam profile. As shown in FIGS. 18A-18C, a mesa including an n-side semiconductor 1802 and a p-side semiconductor 1801 may be arranged on a substrate 1803. Alternatively, the mesa may be arranged on a current spreading layer without a substrate. The red micro-LED shown in FIG. 18C includes secondary optics 1810 at the outcoupling surface 1812 of the substrate 1803. In this example, the secondary optics 1810 is a donut-shaped lens with a maximum thickness where light 1809 exits the outcoupling surface 1812, and a minimum thickness at a center of the lens. The focal point of the lens may be at the active light emitting layer of the micro-LED. The light 1809 may have an intensity distribution 1820 and a beam profile 1821 as shown in FIG. 18D. FIGS. 18E-18H show additional examples of the intensity distribution and beam profile without the lens. FIGS. 18D and 18H show the far field and FIG. 18G shows the near field. Although FIGS. 18A-18H show a red micro-LED having a parabolic mesa 1802, the mesa 1802 may also have a planar, vertical, conical, or semi-parabolic shape.

Figures 19A, 19B:
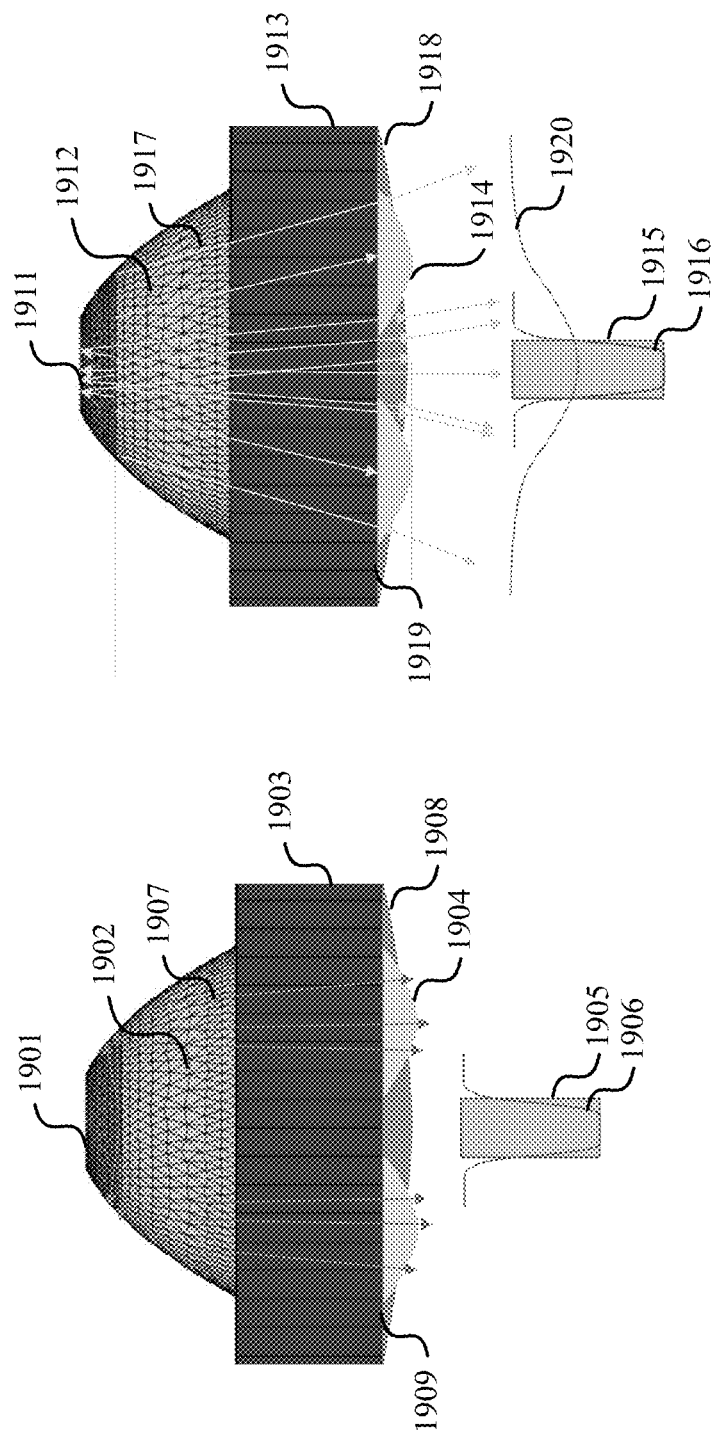
FIGS. 19A and 19B show examples of red and green micro-LEDs having secondary optics to optimize the LEE and the beam profile.

FIGS. 19A and 19B show examples of red and green micro-LEDs having secondary optics to optimize the LEE and the beam profile. As shown in FIG. 19A, a mesa including an n-side semiconductor 1902 and a p-side semiconductor 1901 may be arranged on a substrate 1903. The red micro-LED shown in FIG. 19A includes secondary optics 1904 and 1908 at the outcoupling surface 1909 of the substrate 1903. In this example, the secondary optics 1904 and 1908 include various lenses. The focal point of the lenses may be at the active light emitting layer of the micro-LED. Light 1907 emitted from the active light emitting layer forms a beam profile 1905, and may be shaped to approximate a top-hat beam profile 1906 with a HWHM between ±10° and ±30°.

As shown in FIG. 19B, a mesa including an n-side semiconductor 1912 and a p-side semiconductor 1911 may be arranged on a substrate 1913. The green micro-LED shown in FIG. 19B includes secondary optics 1914 and 1918 at the outcoupling surface 1919 of the substrate 1913. In this example, the secondary optics 1914 and 1918 include various lenses. The focal point of the lens may be at the active light emitting layer of the micro-LED. Light 1917 emitted from the active light emitting layer forms a beam profile 1920 without lens, which is wider than a beam profile 1916 with lens that approximates a top-hat beam profile 1916. The beam profile 1920 of the group of green rays within the micro-LED shown in FIG. 19B has a more Lambertian shape than the narrower beam profile 1905 of the group of red rays reflected at the mesa facet within the micro-LED having the same structure shown in FIG. 19A. A different lens profile and a different focal point are used for the red ray group and the green ray group. The beam profile 1920 of the green ray group in the micro-LED shown in FIG. 19B with a more Lambertian shape is focused towards the center by a larger spherical lens 1918 to get closer to the target top-hat beam profile 1916 of the micro-LED shown in FIG. 19B. The group of red rays is collimated by a donut like lens 1904 having a different shape and focal point to get closer to the target top-hat beam profile 1906 of the micro-LED shown in FIG. 19A. Overall the LEE of micro-LED structures with a lens on the outcoupling surface is higher than the LEE of micro-LED structures without a lens on the outcoupling surface.

Figure 20B:
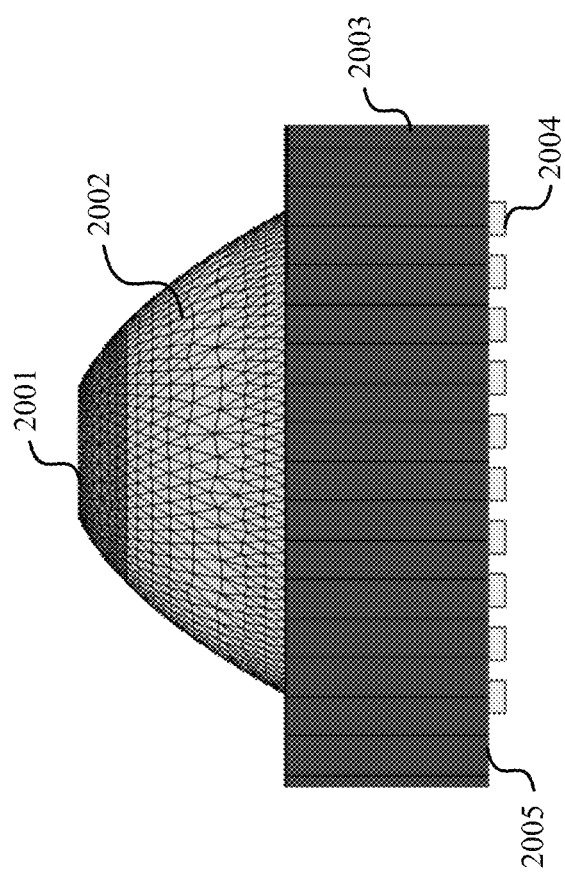
FIGS. 20A and 20B show an example of a green micro-LED that emits polarized light, based on FDTD-Calculations combined with optical Ray-tracing simulations of the optics in micro-LEDs.
Figure 20A:
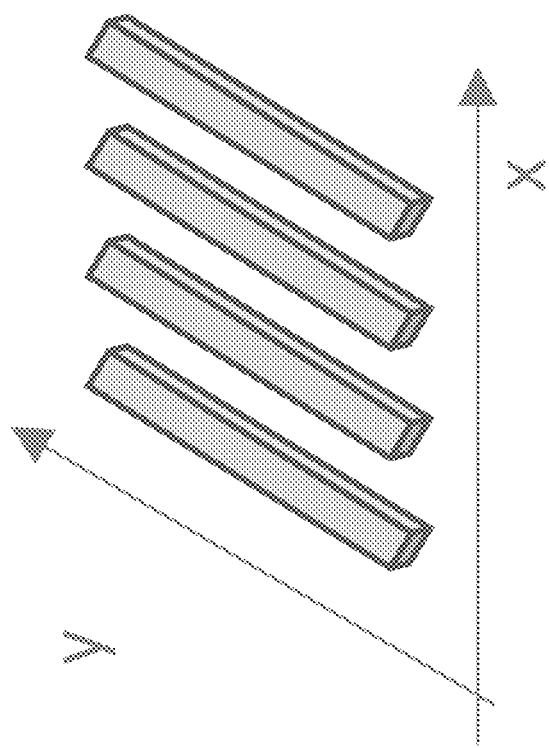

In some embodiments, it may be desirable to produce light that is polarized. FIGS. 20A and 20B show an example of a green micro-LED that emits polarized light. As shown in FIG. 20B, a mesa including an n-side semiconductor 2002 and a p-side semiconductor 2001 may be arranged on a substrate 2003. A linear array grating 2004 may be formed on an outcoupling surface 2005 of the substrate 2003. An example of the linear array grating 2004 is shown in FIG. 20A. The linear array grating 2004 transmits TE light at a different percentage than TM light. The linear array grating 2004 may be etched into the outcoupling surface 2005 or grown as a separate component on the outcoupling surface 2005.

Figure 21B:
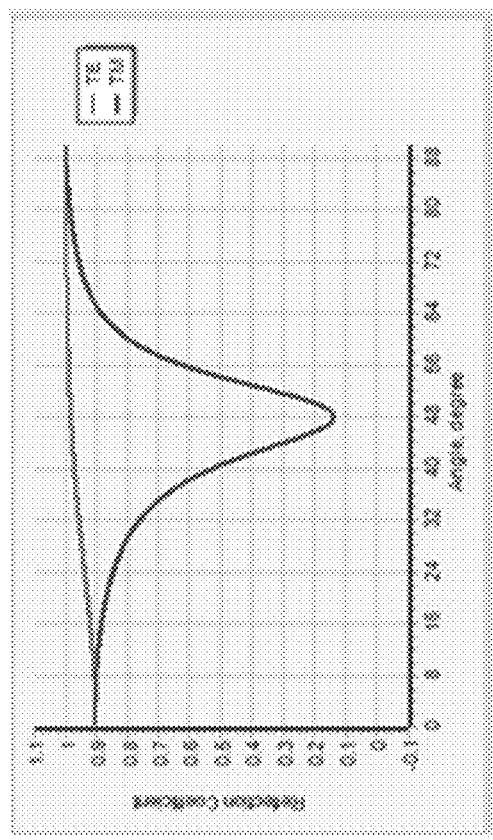
FIGS. 21A and 21B show the reflection coefficient as a function of angle for reflection layer designs of micro-LED configurations that can emit polarized light.
Figure 21A:
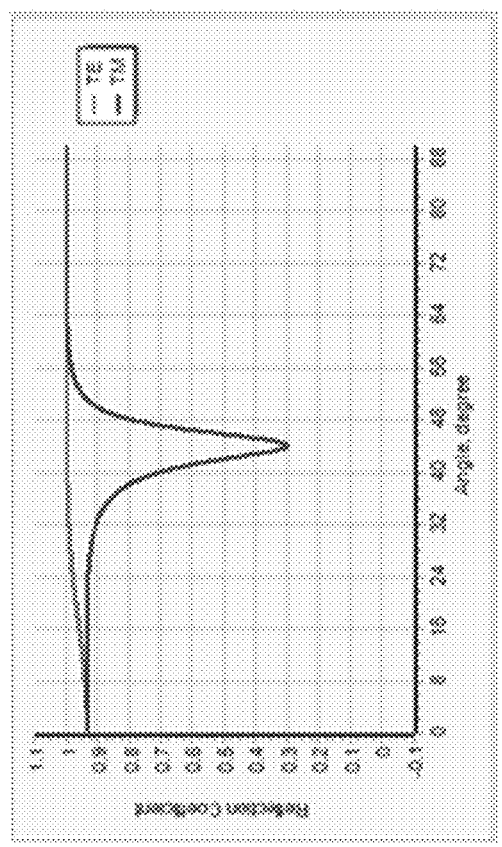
Figure 22B:
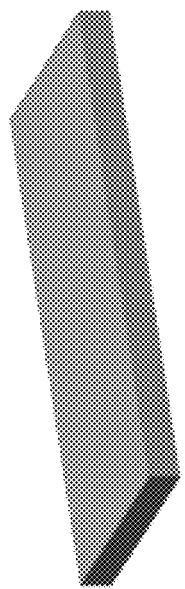
FIG. 22B shows an example of a mesa having a planar shape.
Figure 22D:
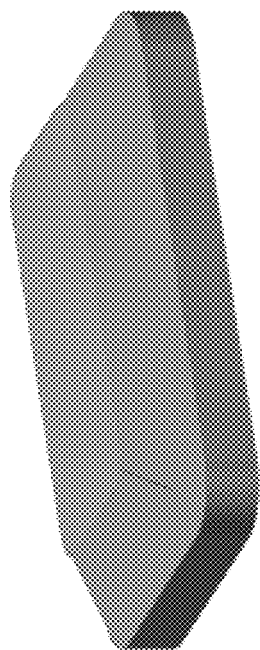
FIG. 22D shows an example of a rectangular base shape that may be used in a micro-LED.
Figure 22A:
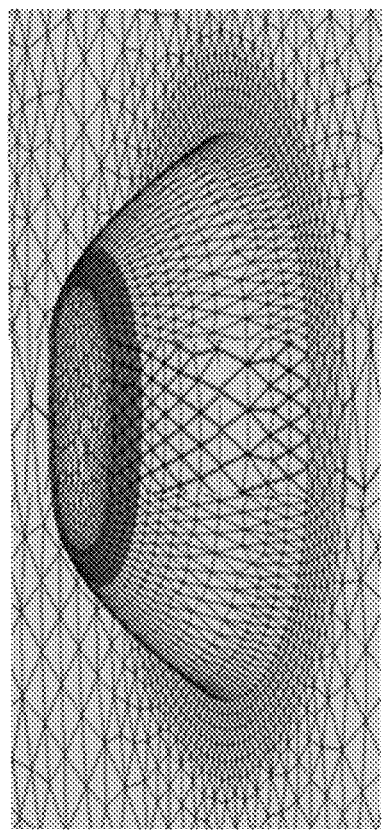
FIG. 22A shows an example of a micro-LED with a mesa having a non-rotationally symmetric elliptical base with a parabolic mesa shape.
Figure 22C:
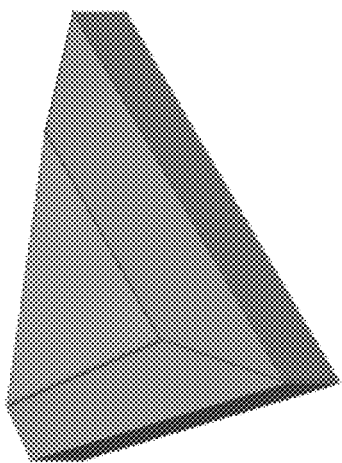
FIG. 22C shows an example of a triangular mesa having a vertical and conical shape.

FIGS. 21A and 21B show the reflection coefficient as a function of angle for various micro-LED configurations. As shown in FIGS. 21A and 21B, the TE/TM-light reflection ratio is approximately 45° at a parabolic mesa facet. The reflector layer design may be optimized for very different reflectivity of light for the TE and TM modes (at around 45° at parabolic mesa facet) inside the micro-LED. Alternatively, the mesa may also have a planar, vertical, conical, or semi-parabolic shape. In other embodiments, the mesa may have a non-rotationally symmetric shape, such as a bathtub-like shape. FIG. 22A shows an example of a micro-LED with a mesa having a non-rotationally symmetric shape. FIG. 22B shows an example of a mesa having a planar shape, in which light may be generated away from the chip edge. FIG. 22C shows an example of a mesa having a conical shape, in which the angle may be 45°±5° for a high LEE via the bottom surface, and may vary slightly for different materials and wavelengths. The micro-LED may also have various base forms, such as circular, elliptical, hexagonal, rectangular, and/or triangular. FIG. 22D shows an example of a base shape that may be used in a micro-LED.

In some embodiments, the efficiency of a micro-LED may be improved by reducing surface recombination at the mesa facet. Due to the small dimensions of the micro-LED, edge effects are significant, because the edges of the mesa are close together. Dangling bonds at the surface cause non-radiative recombination of electrons and holes, such that only 10-20% of the current reaches the active light emitting layer for emission in a red micro-LED having a 1-2 μm diameter MQW.

Current density (J)-reduction may reduce or eliminate surface recombination at the mesa facet. J-reduction can be achieved by various methods, such as ion implantation or quantum mixing. The crystal may be changed locally such that carriers are unable to diffuse to the surface of the mesa. Single Quantum Well (SQW) or Double Quantum Well (DQW) designs may be used for planar, vertical, conical, or parabolic blue or green micro-LEDs at low current densities. Fewer quantum wells with higher carrier concentrations may lead to less lateral carrier spreading inside the active light emitting layer.

Figure 23C:
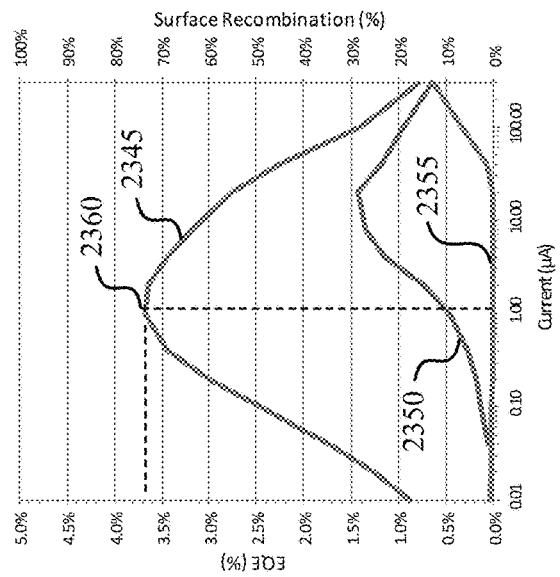
FIGS. 23A-23C show the external quantum efficiency (EQE) and the surface recombination for different non-radiative recombination rates in a green micro-LED.
Figure 23B:
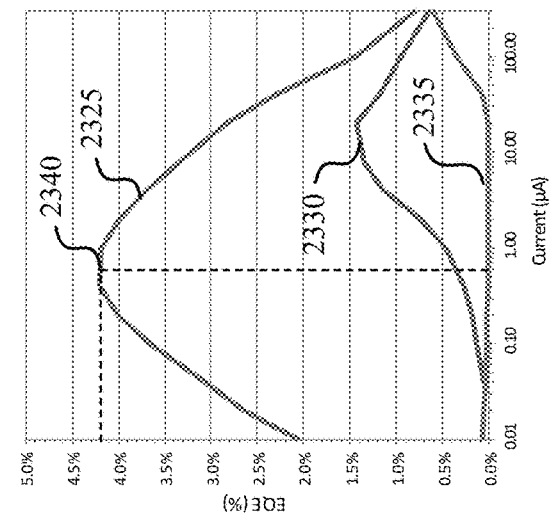
Figure 23A:
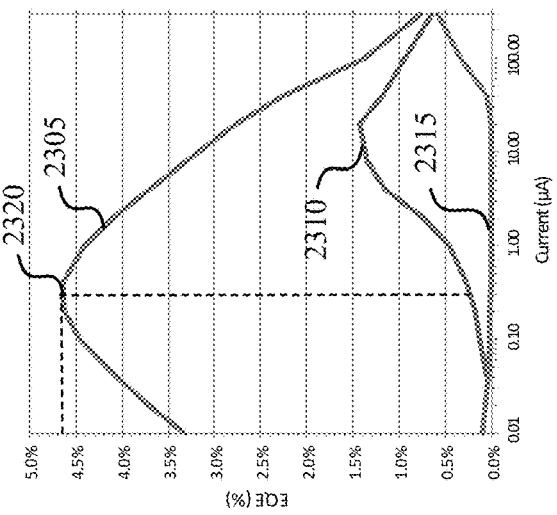

As discussed in further detail below, surface recombination may be reduced by various methods. FIGS. 23A-23C show the EQE and the surface recombination for different carrier lifetimes in a green micro-LED. For example, FIG. 23A shows the simulated EQE 2305 and the measured EQE 2310 for a micro-LED having a carrier lifetime of 200 ns. FIG. 23A also shows the simulated surface recombination 2315. As shown at 2320, the micro-LED has a maximum EQE of 4.6% at a current of 0.2 μA. Similarly, FIG. 23B shows the simulated EQE 2325 and the measured EQE 2330 for a micro-LED having a non-radiative (A*N) carrier lifetime of 40 ns. FIG. 23B also shows the simulated surface recombination 2335. As shown at 2340, the micro-LED has a maximum EQE of 4.2% at a current of 0.5 μA. Likewise, FIG. 23C shows the simulated EQE 2345 and the measured EQE 2350 for a micro-LED having a non-radiative carrier lifetime of 4 ns. FIG. 23C also shows the simulated surface recombination 2355. As shown at 2360, the micro-LED has a maximum EQE of 3.7% at a current of 1.0 μA.

Figures 24A, 24B:
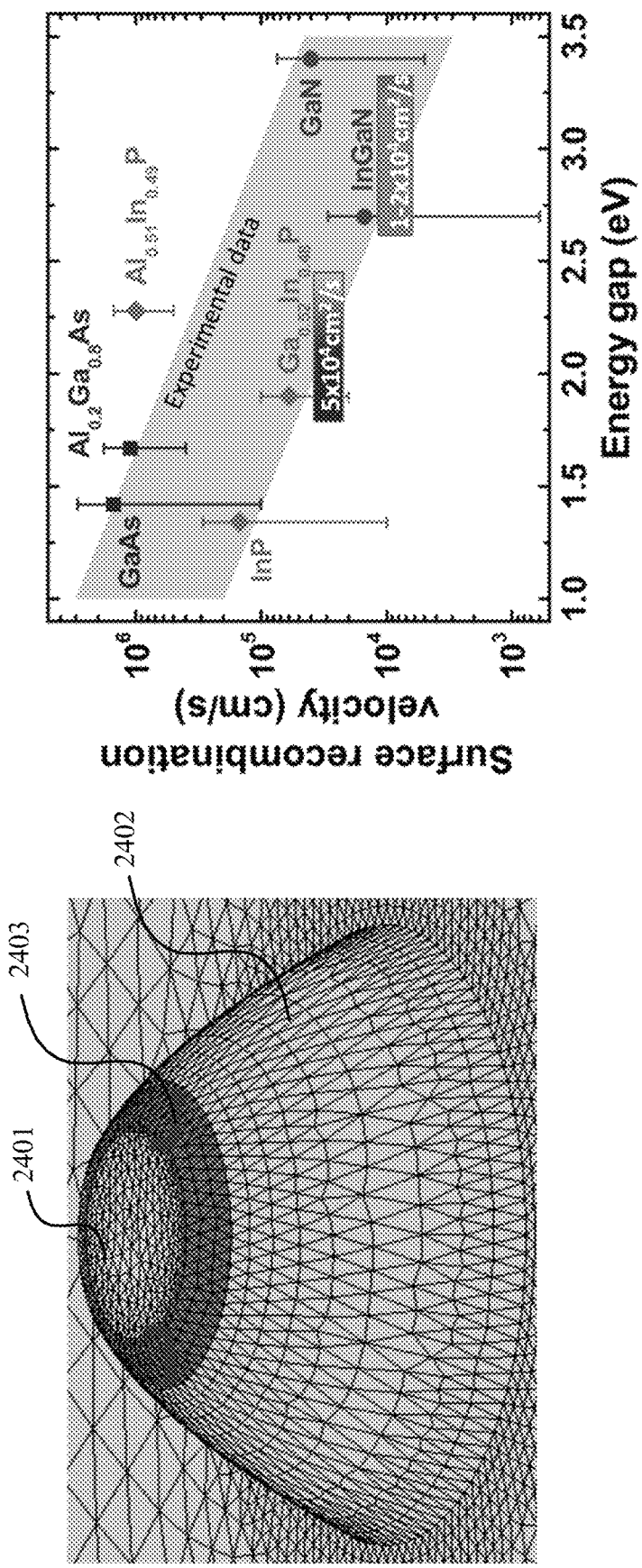
FIG. 24A shows an example of a red micro-LED.
FIG. 24B shows the simulated surface recombination velocity at the mesa facet for a red micro-LED in comparison to blue and green micro-LEDs.

FIGS. 24A and 24B show an example of a method of reducing the surface recombination by reducing the surface states at the mesa facet. As shown in FIG. 24A, a p-contact 2401 may be provided at the top of a mesa 2402, and current 2403 may flow through an active emitting layer, such as a multiple quantum well (MQW). ICP etching may be used to reduce the surface states by smoothing the surface of the mesa facet. Alternatively or in addition, the surface of the mesa facet may be treated by various methods before deposition, such as insitu thermal cleaning, insitu surface cleaning by low energy ions such as electron cyclotron resonance (ECR) ions, or $H_2$-clean in vacuum such as molecular beam epitaxy (MBE). Further, the deposition of a dielectric passivation layer on the surface of the mesa facet may be optimized. For example, a crystalline layer such as AlN may be deposited by MBE, and/or an SiN layer or an $SiO_2$ layer may be deposited by inductively coupled plasma-enhanced chemical vapor deposition (ICPECVD) using a dense plasma with low energy or by atomic layer deposition (ALD). FIG. 24B shows that a low surface recombination velocity (SRV) much less than $10^4$ cm/s may be achieved for various micro-LEDs.

Figure 25C:
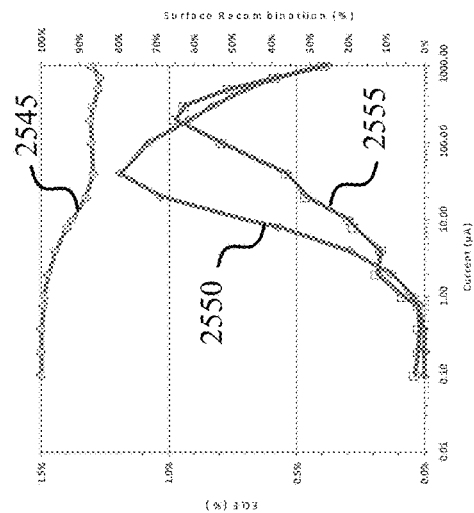
FIGS. 25A-25C show a comparison of the EQE and surface recombination losses for untreated green, blue, and red micro-LEDs.
Figure 25B:
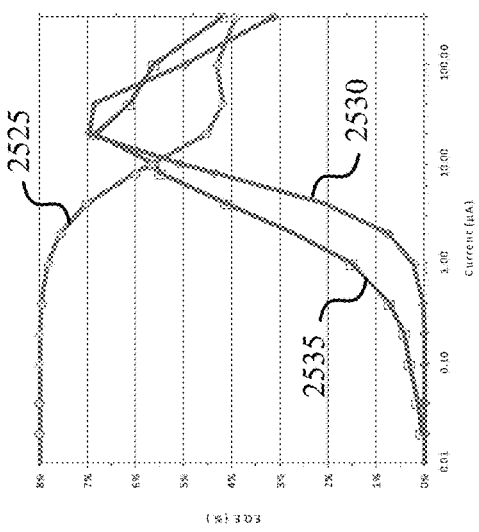
Figure 25A:
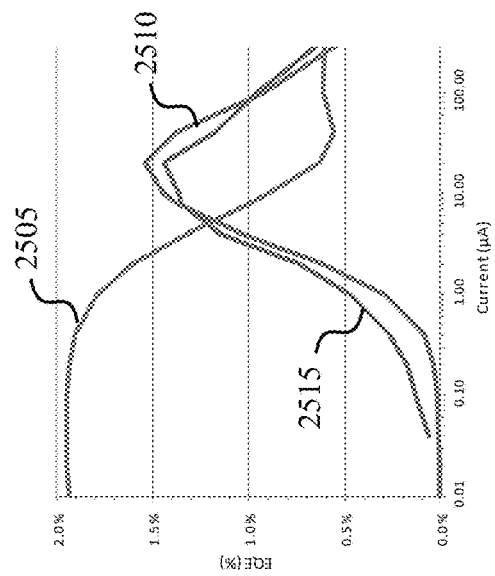

FIGS. 25A-25C show a comparison of the EQE and surface recombination losses for untreated green, blue, and red micro-LEDs. For example, FIG. 25A shows the simulated EQE 2310 and the measured EQE 2315 for a green micro-LED. FIG. 25A also shows the simulated surface recombination 2505. The green micro-LED has approximately 30% surface recombination losses at the maximum EQE due to in-potential fluctuations. Similarly, FIG. 23B shows the simulated EQE 2530 and the measured EQE 2535 for a blue micro-LED. FIG. 23B also shows the simulated surface recombination 2525. The blue micro-LED has the highest EQE, but with 50% surface recombination losses. The blue micro-LED has less in-potential fluctuations than the green micro-LED. Likewise, FIG. 23C shows the simulated EQE 2550 and the measured EQE 2555 for a red micro-LED. FIG. 23C also shows the simulated surface recombination 2545. The red micro-LED has the lowest EQE with greater than 80% surface recombination losses.

Figure 26C:
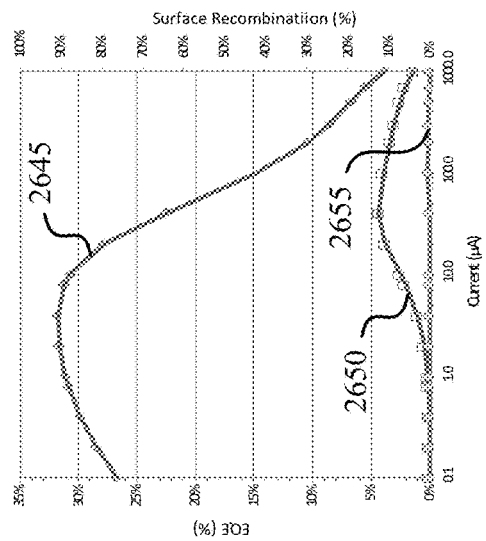
FIGS. 26A-26C show a comparison of the EQE and surface recombination losses for treated green, blue, and red micro-LEDs.
Figure 26B:
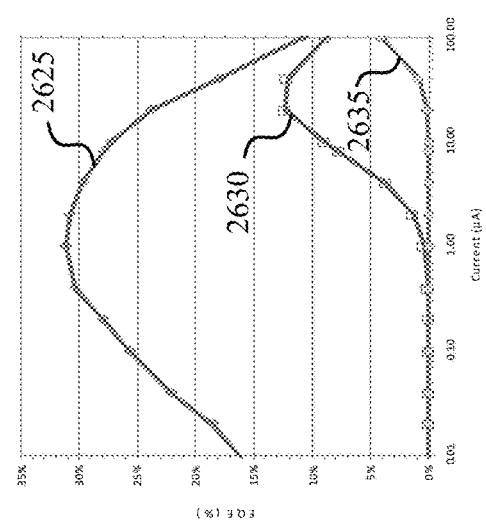
Figure 26A:
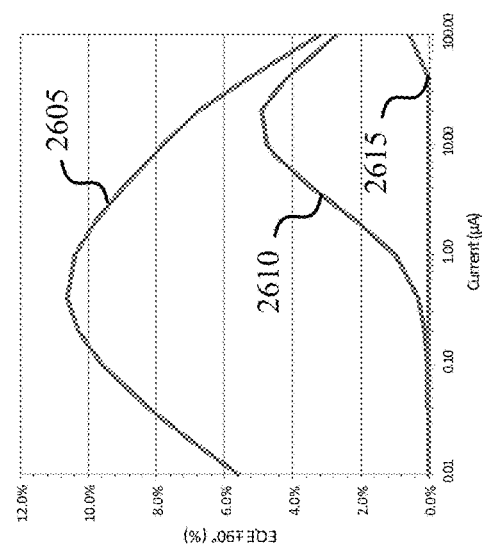

FIGS. 26A-26C show a comparison of the EQE and surface recombination losses for treated green, blue, and red micro-LEDs. The surface recombination losses were reduced by reducing the lateral carrier diffusion and the surface recombination velocity at the mesa facet, as discussed above. For example, FIG. 26A shows the simulated EQE 2605 and the measured EQE 2610 for a green micro-LED. FIG. 26A also shows that the simulated surface recombination and lateral carrier diffusion 2615 is close to zero. The green micro-LED has a maximum EQE of approximately 10% and minimal surface recombination losses. Similarly, FIG. 26B shows the simulated EQE 2630 and the measured EQE 2625 for a blue micro-LED. FIG. 26B also shows that the simulated surface recombination 2635 is close to zero. The blue micro-LED has a maximum EQE of approximately 31% and minimal surface recombination losses. Likewise, FIG. 26C shows the simulated EQE 2650 and the measured EQE 2645 for a red micro-LED. FIG. 26C also shows that the simulated surface recombination 2655 is close to zero. The red micro-LED has a maximum EQE of approximately 33% and minimal surface recombination losses. A comparison of FIGS. 25A-25C with FIGS. 26A-26C indicates that the treatment reduces the surface recombination and increases the EQE for each micro-LED.

Figures 27A, 27B, 27C:
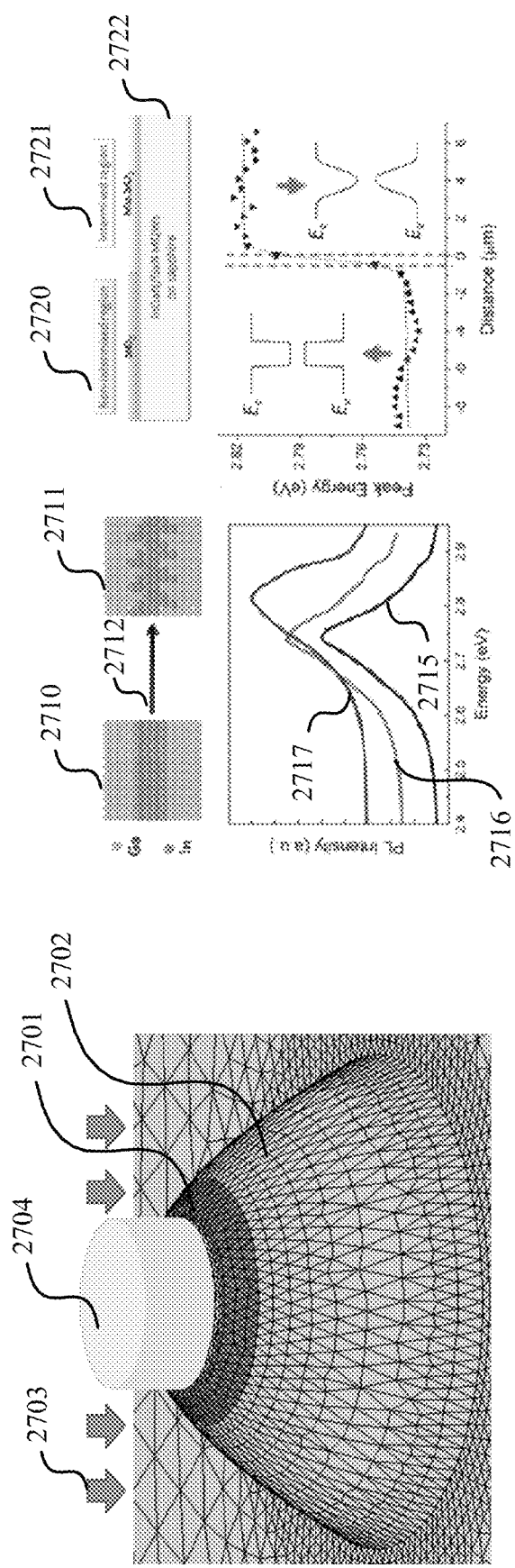
FIGS. 27A-27C show examples of different methods like quantum well (QW)-intermixing for reducing the surface recombination by reducing the lateral electron-hole (e-h) diffusion to the mesa facet inside the active light emitting area.
Figure 29:
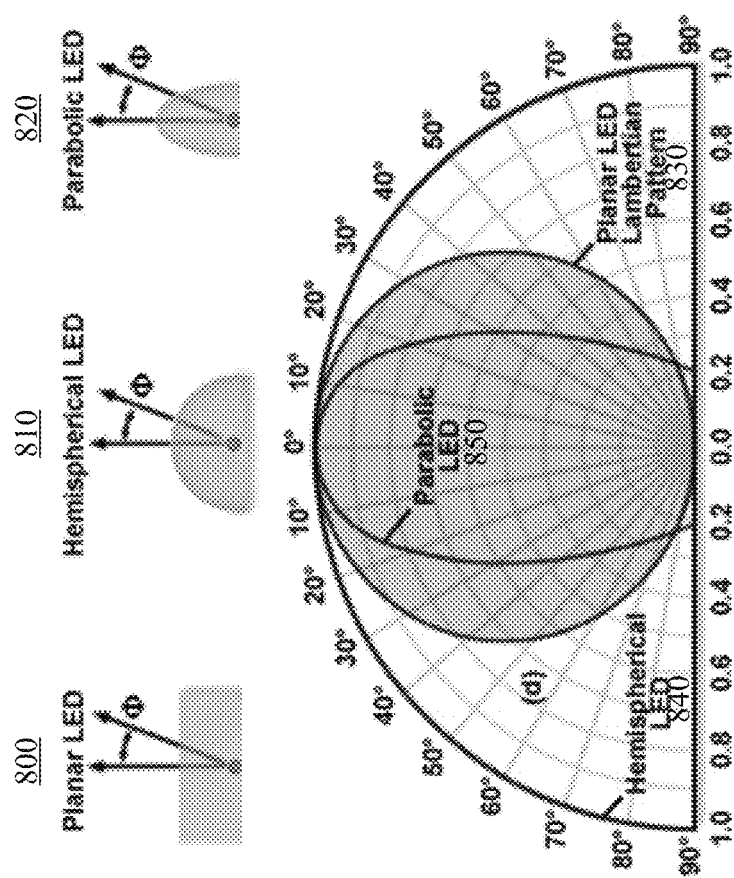
FIG. 29 shows a comparison of far-field emission patterns for different LEDs.

FIGS. 27A-27C show an example of a method of reducing the surface recombination by reducing the lateral electron-hole (e-h) diffusion to the mesa facet inside the active light emitting area. This may modify the strain at the mesa facet, such that in-plane tensile strain increases the band gap of the semiconductor material.

As shown in FIG. 27A, a mesa may include an n-side semiconductor 2702 and a p-side semiconductor 2701. A resist 2704 may be used to mask a central portion of the mesa, and various techniques may be used to reduce the lateral e-h diffusion. For example, ion implantation or quantum well intermixing may be applied along arrows 2703. Planar ion implantation may be applied before or after ICP-etching of the mesa 2702. Off-angle ion implantation may be applied to reduce the amount of defect generation in the active light emitting layer. FIG. 27B shows the separation of the Ga and In atoms 2710 before quantum well intermixing 2712, and the change in the distribution of the Ga and In atoms 2711 after quantum well intermixing 2712. FIG. 27B also includes a graph showing the photoluminescence intensity as a function of energy for various materials. As shown in FIG. 27B, the photoluminescence intensity 2715 for an as-grown sample peaks at 2.74 eV, while the photoluminescence intensity 2716 for a $SiO_2$ capped region peaks at 2.74 eV, and the photoluminescence intensity 2717 for an Mo:$SiO_2$ capped region peaks at 2.82 eV. This shows that different capping leads to lateral different intermixing of atoms in the crystal structure. FIG. 27C shows a comparison between the peak energy as a function of distance for a non-intermixed region 2720 of $SiO_2$ and an intermixed region 2721 of Mo:$SiO_2$. As shown in FIG. 27C, the regions have conduction bands $E_c$ and valence bands $E_v$ with different shapes and levels. This shows that the region with intermixing has a higher peak energy and no light absorption. The higher energy at mesa edge may act as a barrier for lateral carrier diffusion.

FIGS. 28A and 28B show an example of a method of reducing the lateral current spreading by performing lateral ion implantation for a defined current aperture. FIG. 28A shows a micro-LED having a high contact resistance and a high operating voltage $V_f$. This is caused by the small area of the p-contact 2805. In contrast, FIG. 28B shows a p-contact 2825 having a large area, between 20% and 1000% greater than the p-contact 2805. The lateral ion implantation limits the active light emitting layer 2845 to a small area, such as a diameter between 0.5 and 4 μm. The vertical droplet-like broadening of the vertical implantation profile may maintain electrical conductivity of the top p-layer having a larger area than the active light emitting layer 2845 for lower contact resistance with p-metal. A comparison of FIGS. 28A and 28B shows that the lateral current spreading is limited by the performance of lateral ion implantation.

The surface recombination may also be reduced during epitaxy of the mesa shape. For example, the lateral e-h diffusion may be reduced by incorporating quantum dots into the quantum well for lateral carrier confinement. This may also result in a shorter carrier lifetime. Further, using a lateral quantum barrier may provide strain release at the mesa facet and increase the bandgap for tensile trained InGaP quantum wells. Instead of quantum dots, small micron-size quantum wires, fin-wall like structures, and/or nano-wires can also be used.

In some embodiments, the wall-plug efficiency (WPE) of a micro-LED may be increased by reducing the operating voltage $V_f$ of the micro-LED. For example, ion implantation may be used to increase the p-GaN contact area with a smaller current aperture. A droplet implantation design in the vertical direction may increase the p-contact area for lower contact resistance, but define a smaller current aperture above and in the active light emitting layer. To reduce the defect generation caused by ion implantation, a small angle to the surface and crystal planes reduces channeling effects. In addition, thermal annealing after ion implantation reduces crystal damage and non-radiative absorption losses in the active light emitting layer. As an alternative to ion implantation, etching and regrowth may be performed.

Although the micro-LEDs disclosed above are generally described as having a p-side semiconductor above the active light emitting layer and an n-side semiconductor below the active light emitting layer, the polarity could be reversed, such that an n-side semiconductor is formed above the active light emitting layer and a p-side semiconductor is formed below the active light emitting layer. Further, a tunnel junction may be implemented in the epilayer, in order to reduce the contact and series resistance in the micro-LEDs.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium," as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A light emitting diode comprising:
   an active light emitting layer within a semiconductor layer, wherein the semiconductor layer has a mesa shape;
   a substrate comprising a first surface on which the semiconductor layer is positioned and an outcoupling surface opposite to the first surface, wherein light generated by the active light emitting layer is incident on the outcoupling surface and propagates toward an optical element downstream of the outcoupling surface; and
   secondary optics adjacent to the outcoupling surface, wherein:
   the semiconductor layer comprises an n-side semiconductor layer adjacent to the substrate and a p-side semiconductor layer opposite to the active light emitting layer,
   the secondary optics comprise a lens having a focal point at the active light emitting layer, and
   a diameter of the lens is greater than a diameter of the outcoupling surface of the substrate.

2. The light emitting diode of claim 1, wherein the mesa shape is substantially vertical.

3. The light emitting diode of claim 1, wherein the mesa shape is substantially non-vertical.

4. The light emitting diode of claim 1, wherein the mesa shape is at least one of conical, semi-parabolic, or parabolic.

5. The light emitting diode of claim 1, wherein a base area of the mesa shape is at least one of circular, rectangular, hexagonal, or triangular.

6. The light emitting diode of claim 1, wherein the lens is made of a first material, and the semiconductor layer is made of a second material that is different from the first material.

7. The light emitting diode of claim 1, wherein the lens is a spherical lens.

8. The light emitting diode of claim 1, wherein the lens is sized such that the light emitting diode has a light extraction efficiency between 2% and 6% within an emission cone having an angle of 10°.

9. A light emitting diode comprising:
   an active light emitting layer within a semiconductor layer, wherein the semiconductor layer has a mesa shape;
   a substrate comprising a first surface on which the semiconductor layer is positioned and an outcoupling surface opposite to the first surface, wherein light generated by the active light emitting layer is incident on the outcoupling surface and propagates toward an optical element downstream of the outcoupling surface; and at least one of:
   a first anti-reflection coating adjacent to the outcoupling surface;
   an index-matched material between the outcoupling surface and the optical element, wherein an index of refraction of the index-matched material is greater than or equal to an index of refraction of the optical element; or
   secondary optics adjacent to the outcoupling surface, wherein:
   the semiconductor layer comprises an n-side semiconductor layer adjacent to the substrate and a p-side semiconductor layer opposite to the active light emitting layer,
   the mesa shape is non-planar,
   the mesa shape is symmetric about an axis perpendicular to the outcoupling surface,
   light exiting the outcoupling surface has a first beam profile that is non-planar due to the mesa shape being non-planar, and
   the secondary optics is configured to collimate the light exiting the outcoupling surface such that light emitted by the secondary optics has a second beam profile that is narrower than the first beam profile and has a half width at half-maximum (HWHM) less than or equal to 60°.

* * * * *